United States Patent
Shin et al.

(10) Patent No.: US 12,525,532 B2
(45) Date of Patent: Jan. 13, 2026

(54) SEMICONDUCTOR DEVICE AND METHOD FOR MANUFACTURING SEMICONDUCTOR DEVICE

(71) Applicant: Kioxia Corporation, Tokyo (JP)

(72) Inventors: Eiichi Shin, Yokkaichi Mie (JP); Satoshi Hongo, Yokkaichi Mie (JP); Susumu Yamamoto, Yokkaichi Mie (JP); Yukio Katamura, Mie Mie (JP); Gen Toyota, Yokkaichi Mie (JP); Tsutomu Fujita, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 413 days.

(21) Appl. No.: 18/178,346

(22) Filed: Mar. 3, 2023

(65) Prior Publication Data

US 2023/0411287 A1     Dec. 21, 2023

(30) Foreign Application Priority Data

Jun. 16, 2022   (JP) ................................ 2022-097614

(51) Int. Cl.
*H01L 23/528*   (2006.01)
*H01L 23/522*   (2006.01)
*H10B 41/20*   (2023.01)
*H10B 41/35*   (2023.01)
(Continued)

(52) U.S. Cl.
CPC ...... *H01L 23/5283* (2013.01); *H01L 23/5226* (2013.01); *H10B 41/20* (2023.02); *H10B 41/35* (2023.02); *H10B 43/20* (2023.02); *H10B 43/35* (2023.02)

(58) Field of Classification Search
CPC ............. H01L 23/5283; H01L 23/5226; H01L 2225/06541; H01L 25/18; H01L 21/76898; H01L 2224/08146; H01L 25/50; H10B 41/20; H10B 41/35; H10B 43/20; H10B 43/35; H10B 43/50; H10B 43/27

See application file for complete search history.

(56) References Cited

U.S. PATENT DOCUMENTS

| 7,768,125 | B2 | 8/2010 | Chow et al. |
| 8,754,514 | B2 * | 6/2014 | Yu ....................... H01L 25/0657 |
|  |  |  | 257/687 |
| 8,901,727 | B2 | 12/2014 | Kang et al. |

(Continued)

FOREIGN PATENT DOCUMENTS

JP   2013-033952 A   2/2013

*Primary Examiner* — Allison Bernstein
(74) *Attorney, Agent, or Firm* — Foley & Lardner LLP

(57) ABSTRACT

A semiconductor device includes a wiring layer; a first stacked body disposed on the wiring layer; a second stacked body disposed on the first stacked body in a stacking direction; and a first resin body disposed around a periphery of the first stacked body. The first stacked body includes a first pad electrically connected to the wiring layer, a first device layer electrically connected to the first pad, and a first electrode electrically connected to the first device layer. The second stacked body includes a second pad electrically connected to the first electrode and a second device layer electrically connected to the second pad. In the stacking direction, the first resin body is vertically located closer to the wiring layer than an interface between the first stacked body and the second stacked body.

5 Claims, 17 Drawing Sheets

(51) Int. Cl.
*H10B 43/20* (2023.01)
*H10B 43/35* (2023.01)

(56) References Cited

U.S. PATENT DOCUMENTS

| | | | |
|---|---|---|---|
| 2004/0070083 A1* | 4/2004 | Su | H01L 25/0657 |
| | | | 257/E25.023 |
| 2007/0164457 A1* | 7/2007 | Yamaguchi | H01L 25/105 |
| | | | 257/E25.023 |

* cited by examiner

SEMICONDUCTOR DEVICE AND METHOD FOR MANUFACTURING SEMICONDUCTOR DEVICE

CROSS-REFERENCE TO RELATED APPLICATION(S)

This application is based upon and claims the benefit of priority from Japanese Patent Application No. 2022-097614, filed Jun. 16, 2022, the entire contents of which are incorporated herein by reference.

FIELD

Embodiments described herein relate generally to a semiconductor device and a method for manufacturing the same.

BACKGROUND

A stacked device chip is known as an example of a semiconductor device.

DETAILED DESCRIPTION

Figure 1:
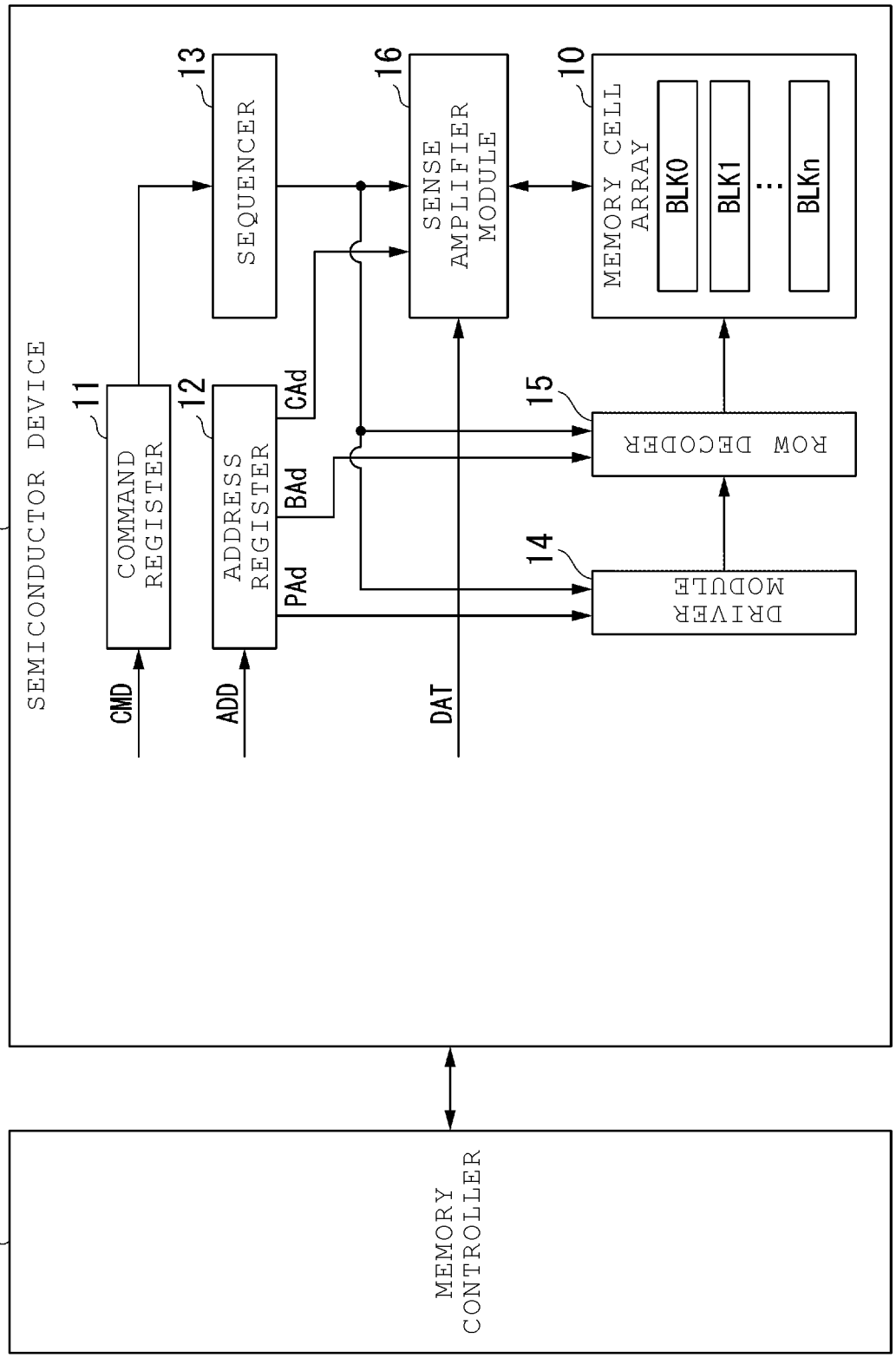
FIG. 1 is a block diagram showing a configuration example of a memory system including a semiconductor device according to a first embodiment.

Embodiments provide a semiconductor device and a method for manufacturing a semiconductor device that can improve electrical characteristics.

In general, according to one embodiment, a semiconductor device includes a wiring layer; a first stacked body disposed on the wiring layer; a second stacked body disposed on the first stacked body in a stacking direction; and a first resin body disposed around a periphery of the first stacked body. The first stacked body includes a first pad electrically connected to the wiring layer, a first device layer electrically connected to the first pad, and a first electrode electrically connected to the first device layer. The second stacked body includes a second pad electrically connected to the first electrode and a second device layer electrically connected to the second pad. In the stacking direction, the first resin body is vertically located closer to the wiring layer than an interface between the first stacked body and the second stacked body.

A semiconductor device and a method for manufacturing a semiconductor device according to embodiments will be described below with reference to the drawings. In the following description, the same reference numerals are given to configurations having the same or similar functions. Thus, duplicate descriptions of these configurations may be omitted. "Connection" is not limited to a physical connection, but also includes an electrical connection. In other words, "connection" is not limited to direct contact, but also includes intervening with another member. "Orthogonal" and "identical" respectively include "substantially orthogonal" and "substantially identical". The drawings are schematic or conceptual, and the relationship between the thickness and width of each portion, the size ratio between portions, and the like are not necessarily the same as the actual ones.

First Embodiment

1. Overall Configuration of Semiconductor Device

In the first embodiment, a memory system including a semiconductor device 1 will be described as an example. FIG. 1 is a block diagram showing a configuration example of a memory system including the semiconductor device 1 according to the first embodiment. A NAND flash memory, for example, is used as the semiconductor device 1. The semiconductor device 1 is controlled by a memory controller 2. Communication between the semiconductor device 1 and the memory controller 2 supports, for example, the NAND interface standard.

As shown in FIG. 1, for example, the semiconductor device 1 includes a memory cell array 10, a command register 11, an address register 12, a sequencer 13, a driver module 14, a row decoder 15, and a sense amplifier module 16.

The memory cell array 10 includes a plurality of blocks BLK0 to BLKn (n is an integer equal to or greater than 1). A block BLK is a set of a plurality of memory cells that can store data in a non-volatile manner and is used as a data erase unit, for example. The memory cell array 10 is provided with a plurality of bit lines and a plurality of word lines. Each memory cell is associated with, for example, one bit line and one word line. A detailed configuration of the memory cell array 10 will be described later.

The command register 11 stores the command CMD received by the semiconductor device 1 from the memory controller 2. The command CMD includes, for example, commands for causing the sequencer 13 to perform a read operation, a write operation, an erasing operation, and the like.

The address register 12 stores address information ADD received by the semiconductor device 1 from the memory controller 2. The address information ADD includes, for example, a block address BAd, a page address PAd, and a column address CAd. For example, the block address BAd, the page address PAd, and the column address CAd are used to select a block BLK, a word line, and a bit line, respectively.

The sequencer 13 controls the operation of the semiconductor device 1 as a whole. For example, the sequencer 13 controls the driver module 14, the row decoder 15, the sense amplifier module 16, and the like based on the command CMD stored in the command register 11 to execute read, write, erasing operations, and the like.

The driver module 14 generates voltages used in read operations, write operations, erasing operations, and the like. Then, the driver module 14 applies the generated voltage to the signal line corresponding to the selected word line based on the page address PAd stored in the address register 12, for example.

The row decoder 15 selects one block in the corresponding memory cell array 10 based on the block address BAd stored in the address register 12. The row decoder 15 transfers, for example, the voltage applied to the signal line corresponding to the selected word line, to the selected word line in the selected block.

The sense amplifier module 16 applies a desired voltage to each bit line according to the write data DAT received from the memory controller 2 in the write operation. In a read operation, the sense amplifier module 16 determines the data stored in the memory cell based on the voltage of the bit line or the current flowing through the bit line and transfers the determination result to the memory controller 2 as read data DAT.

The semiconductor device 1 and the memory controller 2 described above may be combined to form one semiconductor device. Such a semiconductor device includes, for example, a solid state drive (SSD).

Structure of Semiconductor Device

Figure 2:
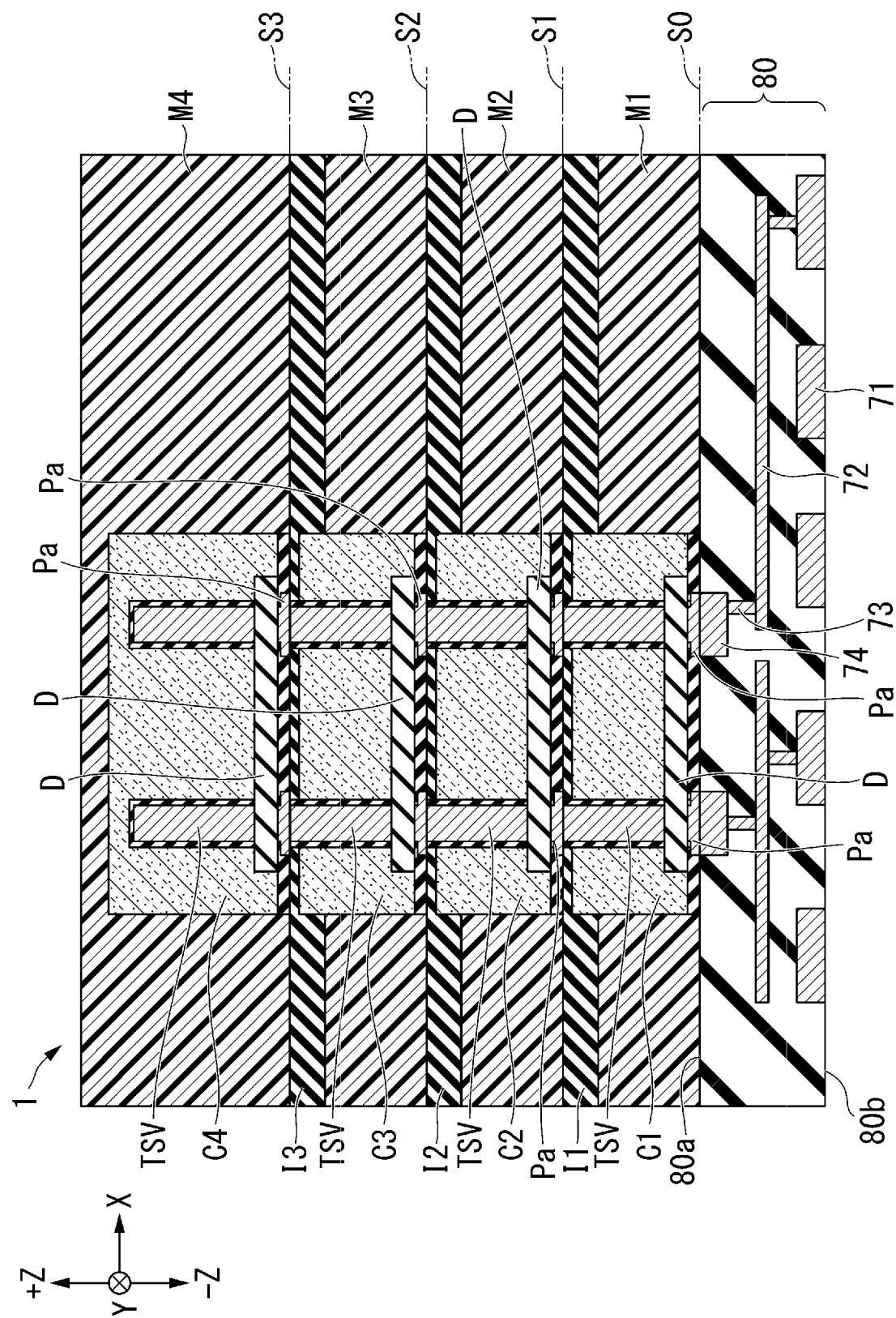
FIG. 2 is a cross-sectional view showing the configuration of the semiconductor device according to the first embodiment.
Figure 3:
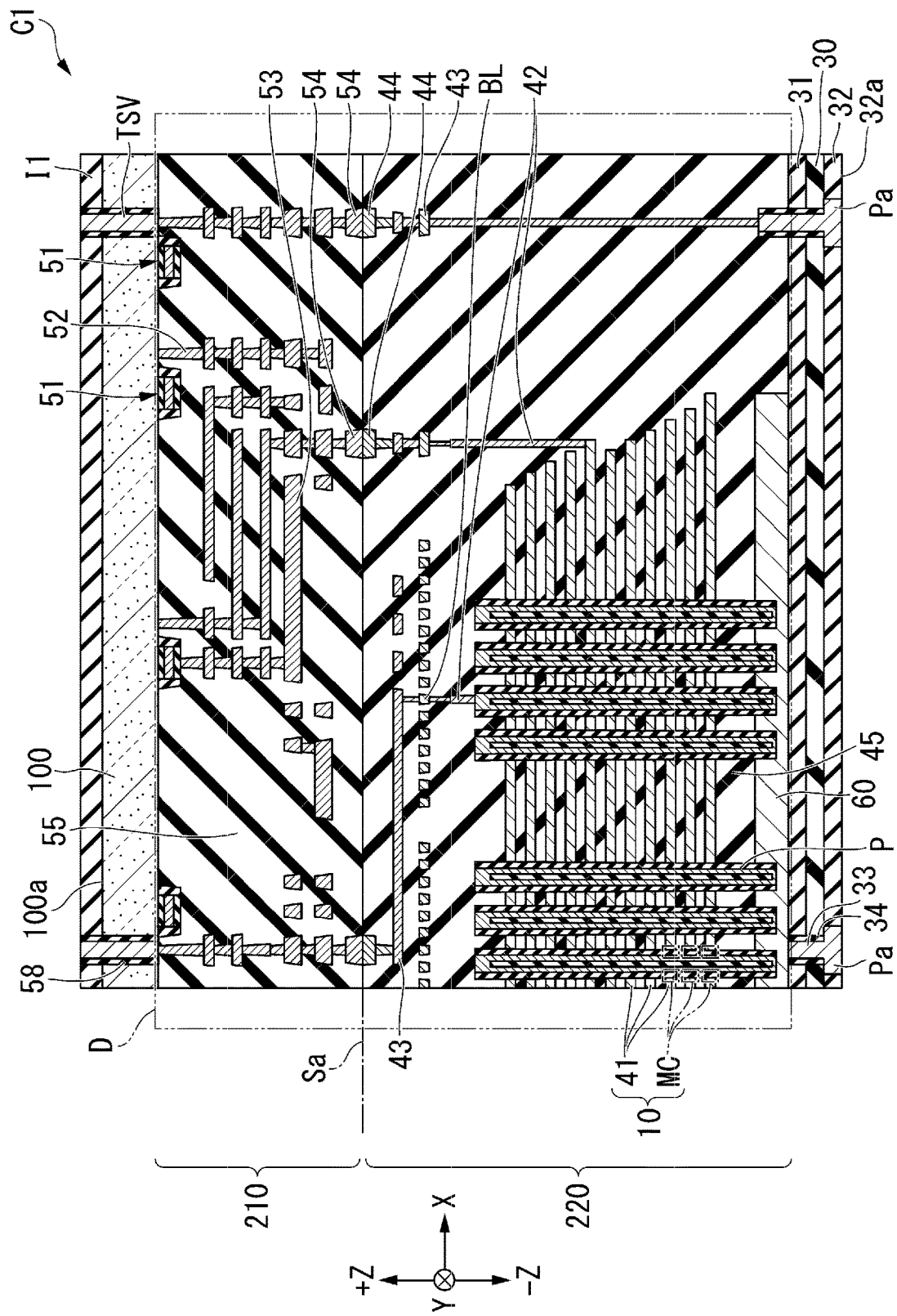
FIG. 3 is a cross-sectional view showing the configuration of a first stacked body of the first embodiment.

An example of the structure of the semiconductor device 1 according to the first embodiment will be described below. FIG. 2 is a cross-sectional view showing the configuration of the semiconductor device 1. The semiconductor device 1 includes, for example, a wiring layer 80, a chip C1 a chip C2, a chip C3, and a chip C4. The semiconductor device 1 further includes a resin body M1 covering at least a part of the periphery of the chip C1, a resin body M2 covering at least a part of the periphery of the chip C2, an insulating layer I1 between the resin bodies M1 and M2, a resin body M3 covering at least a part of the periphery of the chip C3, an insulating layer I2 between the resin bodies M2 and M3, a resin body M4 covering at least a part of the periphery of the chip C4, and an insulating layer I3 between the resin bodies M3 and M4. The pads 74 of the wiring layer 80 are electrically connected to the pads Pa of the chip C1. The chip C1 is an example of a "first stacked body". Also, the chip C2 is an example of a "second stacked body". The pad Pa of the chip C1 is an example of a "first pad". The semiconductor device 1 will be described below.

First, the X direction, Y direction, +Z direction, and −Z direction are defined. The X direction and the Y direction are directions along the surface 80a of the wiring layer 80 (see FIG. 2). The Y direction is a direction that intersects (for example, is perpendicular to) the X direction. The +Z direction and the −Z direction are directions that intersect (for example, are perpendicular to) the X direction and the Y direction, and are the thickness direction of the wiring layer 80. The +Z direction is the direction from the wiring layer 80 toward the chip C1 (see FIG. 2). The −Z direction is the opposite direction to the +Z direction. When the +Z direction and the −Z direction are not distinguished, they are simply referred to as the "Z direction". In the following description, the "+Z direction" may be called "up" and the "−Z direction" may be called "down". It is noted that these expressions are for convenience and do not define the direction of gravity. The Z direction is an example of a "first direction".

The wiring layer 80, the chip C1, the chip C2, the chip C3, and the chip C4 are stacked in this order from bottom to top.

The pads 74 of the wiring layer 80 are electrically connected to the pads Pa of the chip C1 at the interface S0. A through via TSV of the chip C1 is electrically connected to the pad Pa of the chip C2 at the interface S1. A through via TSV of the chip C2 is electrically connected to the pad Pa of the chip C3 at the interface S2. A through via TSV of the chip C3 is electrically connected to the pad Pa of the chip C4 at the interface S3. A device layer D including semiconductor elements and wiring is formed in each of the chips C1 to C4. The device layer D formed on the chip C1 is electrically connected to the pads Pa of the chip C1 and the through vias TSV of the chip C1. The same applies to the chips C2 to C4. The through via TSV may or may not be formed in the chip C4. Details of the device layer D will be described later.

In the semiconductor device 1, the resin body M1, the insulating layer I1, the resin body M2, the insulating layer I2, the resin body M3, the insulating layer I3, and the resin body M4 are stacked in this order. When the direction in which the chip C1 and the chip C2 are stacked is defined as the stacking direction (Z direction), the resin body M1 is closer to the wiring layer 80 than the interface S1 between the chip C1 and the chip C2. Further, the interface between the resin body M1 and the insulating layer I1 is closer to the wiring layer 80 than the interface S1 between the chip C1 and the chip C2. The resin body M2 is closer to the wiring layer 80 than the interface S2 between the chip C2 and the chip C3. Further, the interface between the resin body M2 and the insulating layer I2 is closer to the wiring layer 80 than the interface S2 between the chip C2 and the chip C3. The resin body M3 is closer to the wiring layer 80 than the interface S3 between the chip C3 and the chip C4. Further, the interface between the resin body M3 and the insulating layer I3 is closer to the wiring layer 80 than the interface S3 between the chip C3 and the chip C4. The resin body M1 is an example of a "first resin body".

The wiring layer 80 includes external connection pads 71, wirings 72, plugs 73, and pads 74. The wiring layer has the pad 74 on a surface 80a in contact with the chip C1. The wiring layer 80 also has a plurality of external connection pads 71 on a surface 80b opposite to the surface in contact with the chip C1.

The external connection pad 71 is electrically connected to the wiring 72. The external connection pad 71 electrically connects the pad 74 via the wiring 72 and the plug 73. The plug 73 extends in the Z direction and is a wiring that electrically connects different layers in the wiring layer 80. The wiring 72 is wiring extending in the X direction or the Y direction. The external connection pad 71, the wiring 72, the plug 73, and the pad 74 are formed using a conductive material such as copper (Cu), tungsten (W), or aluminum (Al).

The external connection pad 71 may be an input pad, an output pad, or an input and output pad. Also, the external connection pad 71 may be able to be supplied with power from an external power supply or applied with a reference voltage (for example, ground voltage).

The external connection pad 71 is provided with an external connection terminal (for example, solder balls) not shown, and is electrically connected to the outside of the semiconductor device 1 via the external connection terminal. A signal that may be input via the external connection pad 71 is at least one of a data signal, a control signal, and a data strobe signal.

The data signal is, for example, a signal indicating write target data to be stored in the memory cell array, read target data read from the memory cell array, signals indicating various commands, and signals indicating addresses to which data is written or read.

Control signals are, for example, a chip enable signal, a write enable signal, a read enable signal, a write protect signal, and a ready and busy signal. The chip enable signal is a signal that enables the selection of a semiconductor device 1 to be accessed from among a plurality of semiconductor devices 1. The write enable signal is a signal that enables data (for example, a command CMD or an address ADD) to be transferred to the semiconductor device 1. The read enable signal is a signal that enables data to be read from the semiconductor device 1. The write protect signal is a signal that is asserted when writing and erasing are prohibited. The ready and busy signal is a signal that distinguishably indicates whether the semiconductor device 1 is in a ready state or a busy state.

The data strobe signal is a data strobe signal used for latching a data signal or outputting a data signal.

In the semiconductor device 1, for example, the chip C1 is a chip in which a circuit chip (stacked body) 210 and an array chip (stacked body) 220 are bonded together at the joint surface Sa. The circuit chip 210 includes control circuits (logic circuits) that control the operation of the array chip 220. The structure of the chip C1 will be described in detail below.

The chip C1 includes, for example, a semiconductor layer 100, a stacked body 220, a stacked body 210, an insulating layer 31, a substrate 30, an insulating layer 32, a plug 33, an insulating film 34, a pad Pa, and a through via TSV. The device layer D is the stacked body 210 and the stacked body 220. The device layer D of the chip C1 is an example of a first device layer. The stacked body 220 and the stacked body 210 are stacked in this order from bottom to top. The insulating layer 32, the substrate the insulating layer 31, the stacked body 220, the stacked body 210, the semiconductor layer 100, and the insulating layer I1 are stacked in this order from bottom to top.

The insulating layer 32 has a surface 32a stacked on the wiring layer 80. The pad Pa is exposed on the surface 32a. The insulating layer 32 is formed using, for example, silicon oxide or silicon nitride.

The substrate 30 is positioned between the insulating layer 32 and the insulating layer 31. The substrate 30 is, for example, a semiconductor substrate such as silicon. The plug 33 penetrates the substrate 30 in the Z direction and is electrically connected to the pad Pa. The insulating film 34 is provided between the plug 33 and the substrate The plug 33 penetrates the insulating layer 31 in the Z direction and is electrically connected to the wiring 43. The pad Pa is electrically connected to a wiring 43. The plug 33 and the pad Pa are formed using a conductive material such as copper (Cu), tungsten (W), or aluminum (Al).

The insulating layer 31 is located between the stacked body 220 and the substrate 30. The insulating layer 31 is formed using, for example, silicon oxide or silicon nitride.

The stacked body 220 includes the memory cell array a plurality of plugs 42, a plurality of wirings 43, a plurality of pads 44, and an insulator 45. The insulator is between the semiconductor layer 100 and the wiring layer 80.

The memory cell array 10 is provided above a source line 60. The memory cell array 10 has a plurality of conductive layers 41 and a plurality of memory pillars P. Each of the plurality of conductive layers 41 and the plurality of memory pillars P is connected to the plug 42. Also, the plurality of memory pillars P are connected to the source line 60.

The plurality of conductive layers 41 are formed using, for example, tungsten (W) or impurity-doped polysilicon (Poly-Si). The plurality of conductive layers 41 are stacked in the Z direction with an interlayer insulating film 45b (see FIG. 4) provided in the insulator 45 interposed therebetween. Among the plurality of conductive layers 41, the conductive layers 41 on the stacked body 210 side (+Z direction side), in this embodiment, the four conductive layers 41 on the stacked body 210 side function as the drain-side select gate line SGD. Among the plurality of conductive layers 41, the conductive layers 41 on the source line 60 side (−Z direction side), in this embodiment, one conductive layer 41 on the source line 60 side functions as the source-side select gate line SGS. The remaining conductive layers 41 positioned between the drain-side select gate line SGD and the source-side select gate line SGS among the plurality of conductive layers 41 function as a plurality of word lines WL.

The plurality of memory pillars P extend in the Z direction and penetrate the drain-side select gate line SGD, the plurality of word lines WL, and the source-side select gate line SGS. The memory pillar P is electrically connected to the bit line BL through the plug 42 and electrically connected to the source line 60.

A memory cell MC is formed at each intersection of the plurality of word lines WL and the plurality of memory pillars P. Thus, the plurality of memory cells MC are located three-dimensionally with intervals in the X, Y, and Z directions. The memory cell MC will be described later in detail.

The plugs 42, the wirings 43, and the pads 44 electrically connect the memory cell array 10 and the stacked body 210. The plugs 42, the wirings 43, and the pads 44 are formed using a conductive material such as copper, tungsten, or aluminum. The plug 42 is a wiring that extends in the Z direction and electrically connects different layers in the stacked body 220. The wiring 43 is a wiring that extends in the X direction or the Y direction.

The pad 44 is a connection electrode provided on the stacked body 220. In a state in which the stacked body 220 and the stacked body 210 are stacked, the pad 44 of the stacked body 220 is joined to the pad 54 of the stacked body 210.

The insulator 45 is provided between the plurality of plugs 42, the plurality of wirings 43, and the plurality of pads 44 to electrically insulate these elements from each other. That is, the plurality of plugs 42, the plurality of wirings 43, and the plurality of pads 44 are provided on the insulator 45. The insulator 45 is formed using, for example, silicon oxide or silicon nitride.

The source line 60 is, for example, a two-layer film including a lower layer portion using tungsten (W) and an upper layer portion using silicon (Si). The source line is located in the region where the memory cell array 10 is located. Each portion of the source line 60 may be supplied with a potential from the stacked body 210.

The stacked body 210 is provided on the stacked body 220. The stacked body 210 is located between the semiconductor layer 100 and the stacked body 220 in the Z direction. The stacked body 210 includes a plurality of transistors 51, a plurality of plugs 52, a plurality of wirings 53, a plurality of pads 54, and an insulator 55. The through via TSV is connected to the wiring 43 via the wiring 53. The through via TSV of the chip C1 is an example of the "first electrode".

The transistor 51 is provided on the semiconductor layer 100. The transistor 51 is connected to the plug 52. The transistor 51 is electrically connected to the memory cell array 10 via the plugs 42 and 52, the wirings 43 and 53, and the pads 44 and 54. The transistor 51 controls the memory cell array 10, for example.

The plugs 52, the wirings 53, and the pads 54 electrically connect the plurality of transistors 51 and the stacked body 220. The plugs 52, the wirings 53, and the pads 54 are formed using a conductive material such as copper, tungsten, or aluminum. The plug 52 is a wiring that extends in the Z direction and electrically connects different layers in the stacked body 210. The wiring 53 is a wiring that extends in the X direction or the Y direction.

The pad 54 is a connection electrode provided on the stacked body 210. In a state in which the stacked body 220 and the stacked body 210 are stacked, the pads 54 of the stacked body 210 are provided on the pads 44 of the stacked body 220 and joined to the pads 44 of the stacked body 220.

The insulator 55 is provided between the plurality of plugs 52, the plurality of wirings 53, and the plurality of pads 54 to electrically insulate these elements from each other. That is, the plurality of plugs 52, the plurality of wirings 53, and the plurality of pads 54 are provided on the insulator 55. The insulator 55 is formed using, for example, silicon oxide ($SiO_2$) or silicon nitride (SiN). In a state in which the stacked body 220 and the stacked body 210 are stacked, the insulator 55 of the stacked body 210 is in contact with the insulator 45 of the stacked body 220.

The semiconductor layer 100 is, for example, a semiconductor layer using silicon or the like. The semiconductor layer 100 has a surface 100a on which the stacked body 210 is stacked. The semiconductor layer 100 is provided with source regions and drain regions of the transistors provided in the stacked body 210. The through via TSV penetrates the semiconductor layer 100 in the Z direction (stacking direction). Also, the through via TSV is electrically connected to the wiring 43. An insulating film 58 is provided between the through via TSV and the semiconductor layer 100.

The insulating layer I1 is provided on the semiconductor layer 100. The insulating layer I1 is formed using, for example, silicon oxide or silicon nitride. The through via TSV is exposed on a surface I1a of the insulating layer I1 and electrically connected to the pad Pa of the chip C2.

Figure 4:
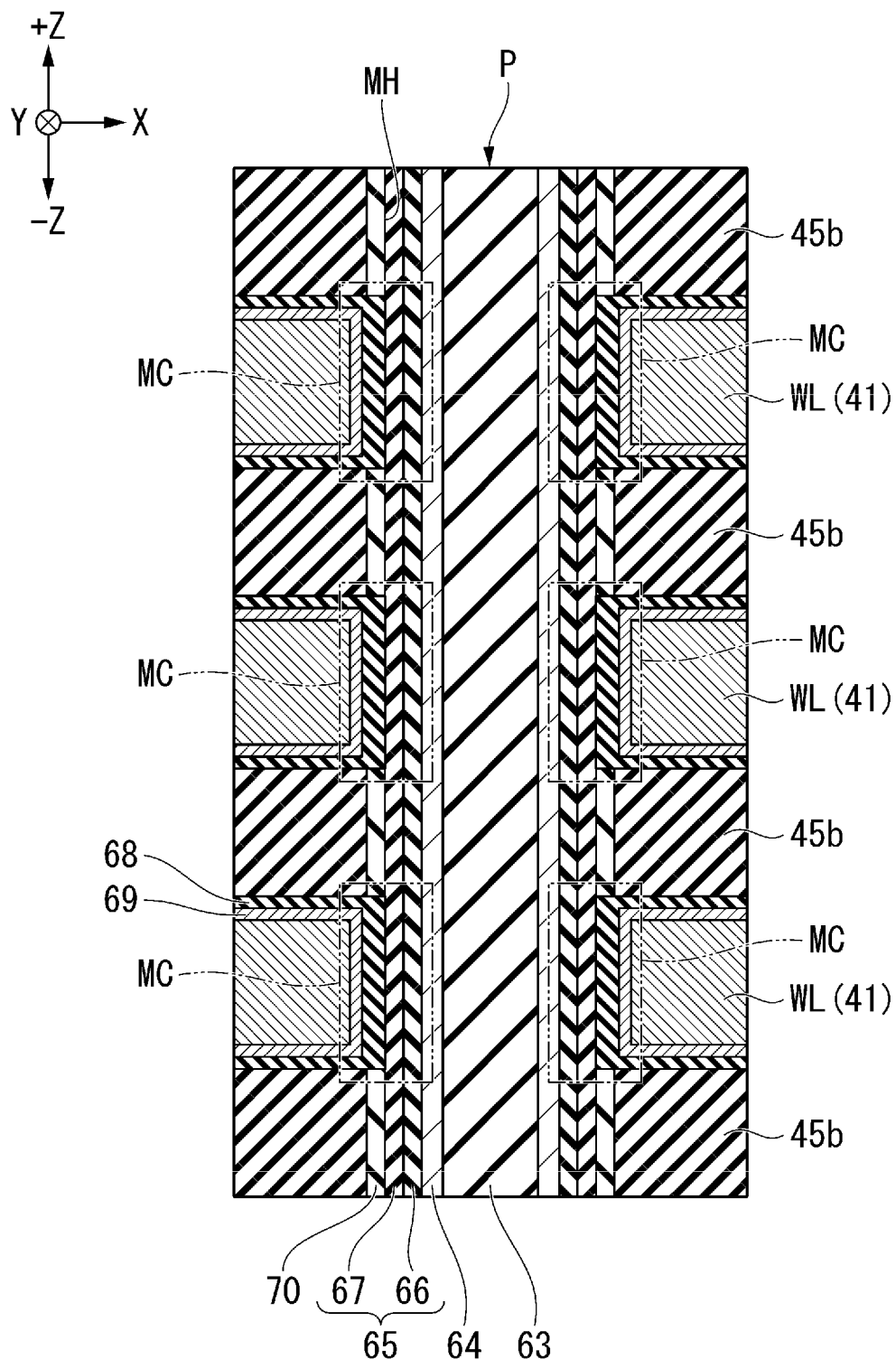
FIG. 4 is a cross-sectional view showing the vicinity of a memory pillar of a memory cell array of the first embodiment.

FIG. 4 is a cross-sectional view showing the vicinity of the memory pillar P of the memory cell array 10. As shown in FIG. 4, a plurality of word lines WL are stacked in the Z direction with the interlayer insulating film 45b interposed therebetween. The plurality of word lines WL extends in the X direction. The memory cell array 10 includes memory holes MH in which memory pillars P are provided. The memory pillar P extends in the Z direction in the memory hole MH and penetrates the plurality of word lines WL.

The memory pillar P has, for example, a circular or elliptical shape when viewed from the Z direction. The memory pillar P includes a core insulator 63, a semiconductor body 64, and a memory film 65 in order from the inside.

The core insulator 63 is a columnar body extending in the Z direction. The core insulator 63 includes, for example, silicon oxide. The core insulator 63 is in the semiconductor body 64.

The semiconductor body 64 extends in the Z direction and functions as a channel. The semiconductor body 64 is connected to the source line 60. The semiconductor body 64 covers the outer peripheral surface of the core insulator 63. The semiconductor body 64 contains, for example, silicon. Silicon is, for example, polysilicon obtained by crystallizing amorphous silicon.

The memory film 65 extends in the Z direction. The memory film 65 covers the outer peripheral surface of the semiconductor body 64. The memory film 65 is located between the inner surface of the memory hole MH and the outer surface of the semiconductor body 64. The memory film 65 includes, for example, a tunnel insulating film 66 and a charge storage film 67.

The tunnel insulating film 66 is located between the charge storage film 67 and the semiconductor body 64. The tunnel insulating film 66 includes, for example, silicon oxide, or silicon oxide and silicon nitride. The tunnel insulating film 66 is a potential barrier between the semiconductor body 64 and the charge storage film 67.

The charge storage film 67 is provided between the tunnel insulating film 66 and each of the word line WL and the interlayer insulating film 45b. The charge storage film 67 contains silicon nitride, for example. The intersections of the charge storage film 67 and the word lines WL function as memory cells MC. The memory cell MC stores data depending on the presence or absence of charge in the intersection (charge storage portion) between the charge storage film 67 and the word line WL or the amount of stored charge. The charge storage portion is between the word line WL and the semiconductor body 64 and is surrounded by an insulating material.

A block insulating film 68 and a barrier film 69 may be provided between the word line WL and the interlayer insulating film 45b and between the word line WL and the memory film 65. The block insulating film 68 is an insulating film that prevents back tunneling. Back tunneling is a phenomenon in which charges return from the word line WL to the memory film 65. For the block insulating film 68, for example, a silicon oxide film, a metal oxide film, or a stacked structure film in which a plurality of insulating films are stacked is used. An example of a metal oxide is aluminum oxide. The barrier film 69 is, for example, a titanium nitride film or a stacked structure film of titanium nitride and titanium.

A cover insulating film 70 may be provided between the interlayer insulating film 45b and the charge storage film 67. The cover insulating film 70 contains, for example, silicon oxide. The cover insulating film 70 protects the charge storage film 67 from etching during processing. The cover insulating film 70 may be omitted, or a portion thereof may be left between the conductive layer 41 and the charge storage film 67 and used as a block insulating film.

In the semiconductor device 1, the chip C2, the chip C3, and the chip C4 also have the same structure as the chip C1. The semiconductor layer 100 of the chip C2 is an example of a "second semiconductor layer". The device layer D of the chip C2 is an example of a second device layer. The pad Pa of the chip C2 electrically connected to the wiring 43 of the chip C2 and electrically connected to the through via TSV is an example of a "second pad".

The first embodiment has been described above. In the semiconductor device 1 according to the first embodiment, the resin body M1, which is a first resin body, is located closer to the wiring layer 80 than the interface between the chip C1 and the chip C2. Therefore, when stacking the chip C2 on the chip C1, the resin body M1 does not hinder the stacking. As a result, the reliability of the electrical connection is improved and the electrical characteristics are improved.

Method for Manufacturing Semiconductor Device

Figure 5:
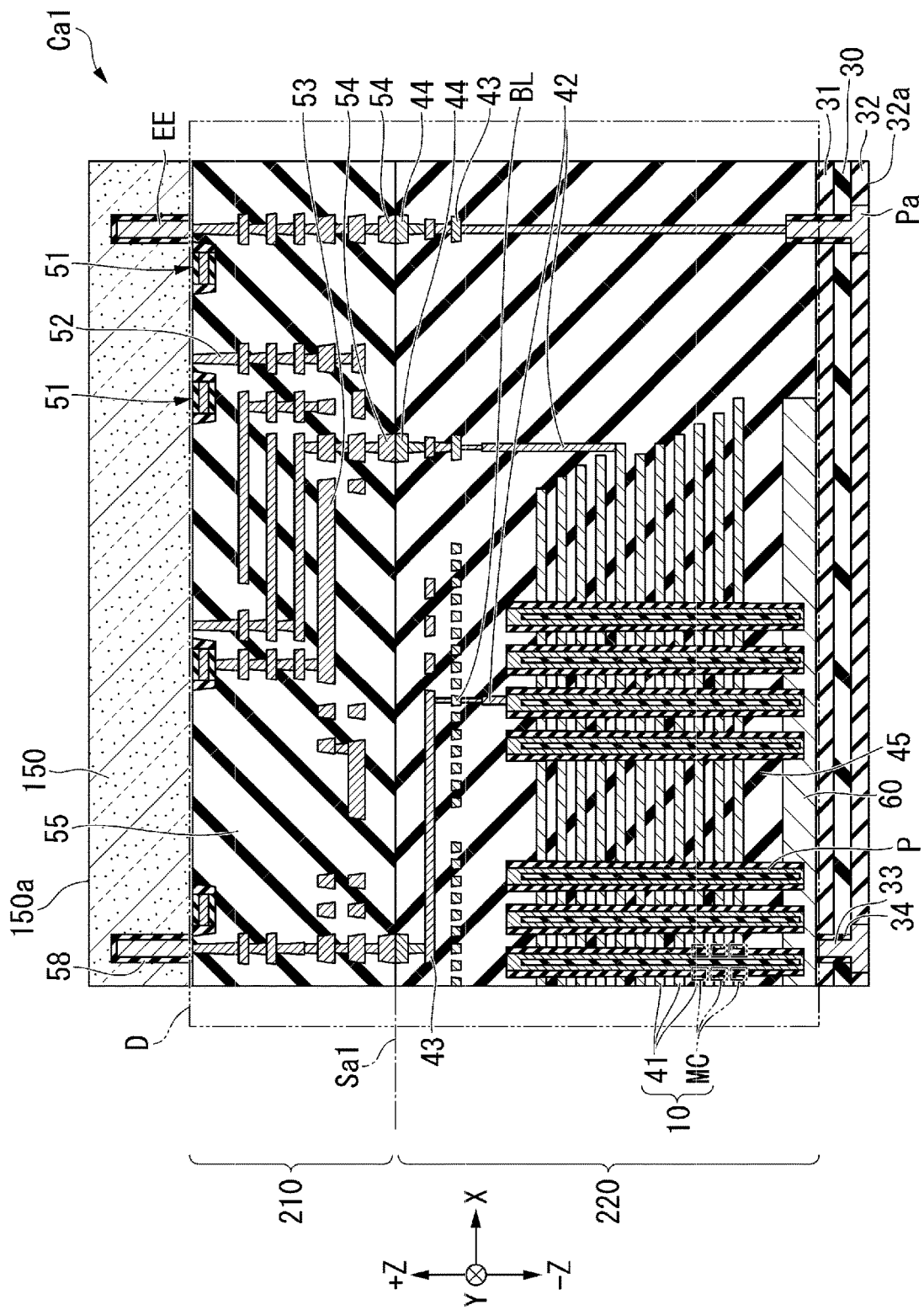
FIG. 5 is a cross-sectional view showing a configuration of a first intermediate stacked body of the first embodiment.
Figure 6:
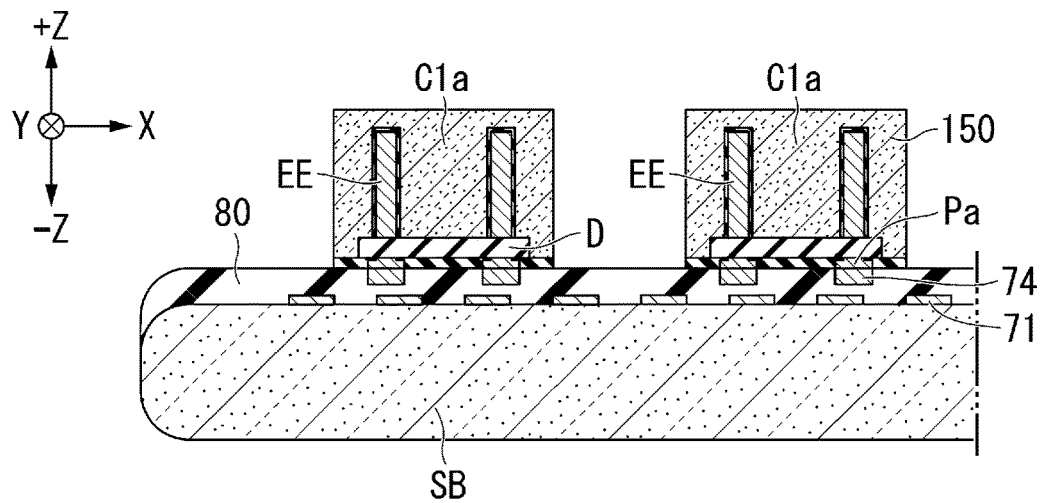
FIG. 6 is a cross-sectional view showing a method for manufacturing the semiconductor device according to the first embodiment.

A method for manufacturing the semiconductor device 1 will be described. FIG. 5 is a cross-sectional view of a first intermediate stacked body for manufacturing the chip C1, which is the first stacked body. FIG. 6 shows an example of the manufacturing process of the semiconductor device 1, and is a cross-sectional view of the stacked body of the semiconductor device 1. Each drawing from FIGS. 6 to 13 is a cross-sectional view of the component in each manufacturing process when viewed along the Y direction.

FIG. 5 is a cross-sectional view of a first intermediate stacked body C1a, which is an intermediate product for manufacturing the chip C1. For example, a circuit wafer (not shown) that forms the stacked body 210 and an array wafer (not shown) that forms the stacked body 220 are bonded together and annealed to reduce the thickness of the array wafer. The insulating layer 32 and the pad Pa are formed on the obtained array wafer, and the first intermediate stacked body C1a is obtained by dicing. The first intermediate stacked body C1a includes the stacked body 220 and the stacked body 210. The stacked body 210 and the stacked body 220 of the first intermediate stacked body C1a are examples of the first device layer. The stacked body 210 and the stacked body 220 of the first intermediate stacked body C1a are electrically connected to the pad Pa of the first intermediate stacked body C1a. In the first intermediate stacked body C1a, the description of the same configuration as that of the chip C1, which is the first stacked body, will be omitted. A semiconductor substrate 150 is provided on the stacked body 210. An electrode EE is electrically connected to the device layer D and embedded in the semiconductor substrate 150. The semiconductor substrate 150 of the first intermediate stacked body C1a is an example of a first semiconductor substrate. Also, the electrode EE extends in the Z direction (thickness direction of the semiconductor substrate 150). An insulating film 58 is provided between the electrode EE and the semiconductor substrate 150. The electrode EE is an example of a "first electrode". The first intermediate stacked body C1a is an example of a first stacked body. The device layer D of the first intermediate stacked body C1a is an example of the first device layer.

FIG. 6 is a cross-sectional view showing the method for manufacturing the semiconductor device 1 of the first embodiment. In FIG. 6, the wiring layer 80 is provided on a support substrate SB. The first intermediate stacked body C1a is stacked so that the pad Pa of the first intermediate stacked body C1a is connected to the wiring layer 80. The direction in which the wiring layer 80 and the first intermediate stacked body C1a are stacked is defined as a first stacking direction (Z direction). The support substrate SB and the wiring layer 80 provided on the support substrate SB are examples of the "substrate".

Figure 7:
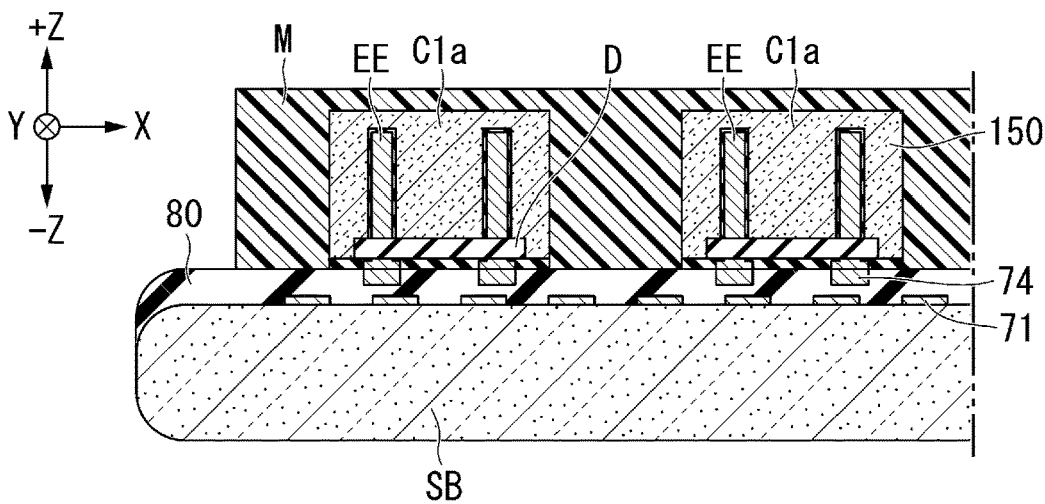
FIG. 7 is a cross-sectional view showing the method for manufacturing the semiconductor device according to the first embodiment.

As shown in FIG. 7, after stacking the first intermediate stacked body C1a on the wiring layer 80, the first intermediate stacked body C1a is covered with the resin body M. At this time, the wiring layer 80 is also covered. The resin body M can be made of a resin used for chip protection.

Figure 8:
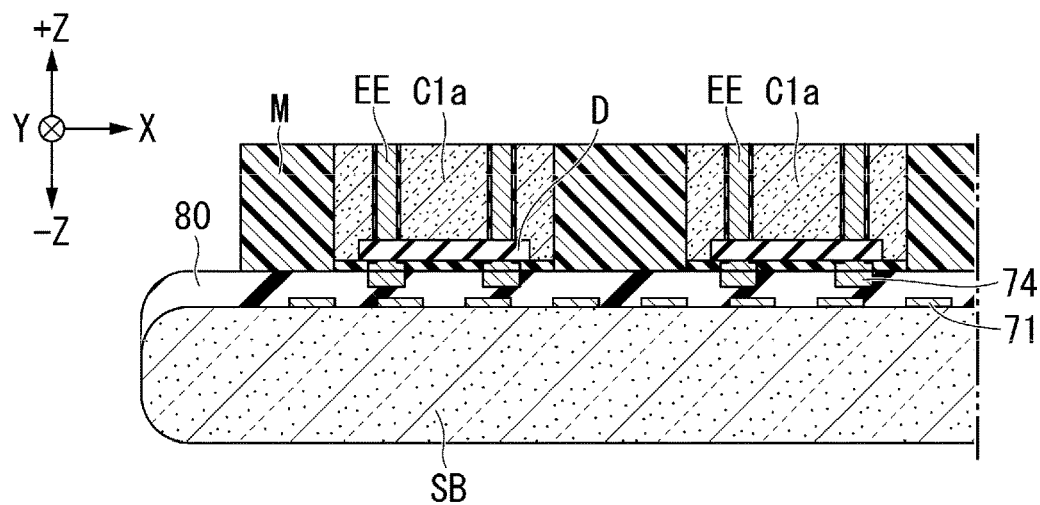
FIG. 8 is a cross-sectional view showing the method for manufacturing the semiconductor device according to the first embodiment.

As shown in FIG. 8, after covering the first intermediate stacked body C1a with the resin body M, the semiconductor substrate 150 and the resin body M are polished by, for example, a backside grinder and chemical mechanical polishing (CMP) in the thickness direction (Z direction) of the semiconductor substrate 150 to expose the electrode EE.

Figure 9:
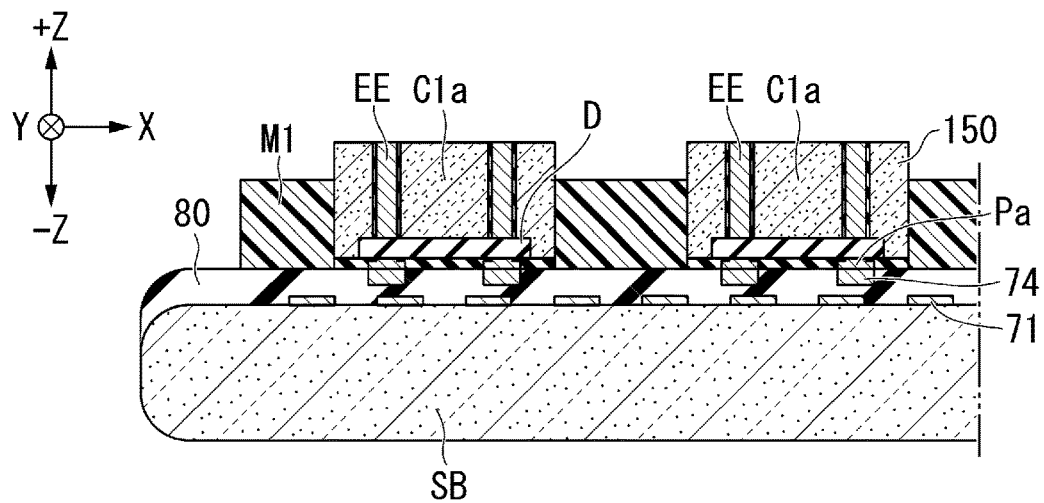
FIG. 9 is a cross-sectional view showing the method for manufacturing the semiconductor device according to the first embodiment.

As shown in FIG. 9, a part of the resin body M is removed so that the height of the resin body M in the first stacking direction (Z direction) is lower than the surface of the polished first intermediate stacked body C1a. The method of removing a part of the resin body M is not particularly limited. For example, a part of the resin body M may be removed by dicing. The resin body M1 is formed by removing a part of the resin body M. A part of the resin body M is removed so that the resin body M1 is closer to the support substrate SB than the interface between the chip C1 and a second intermediate stacked body C2a, which will be described later.

Figure 10:
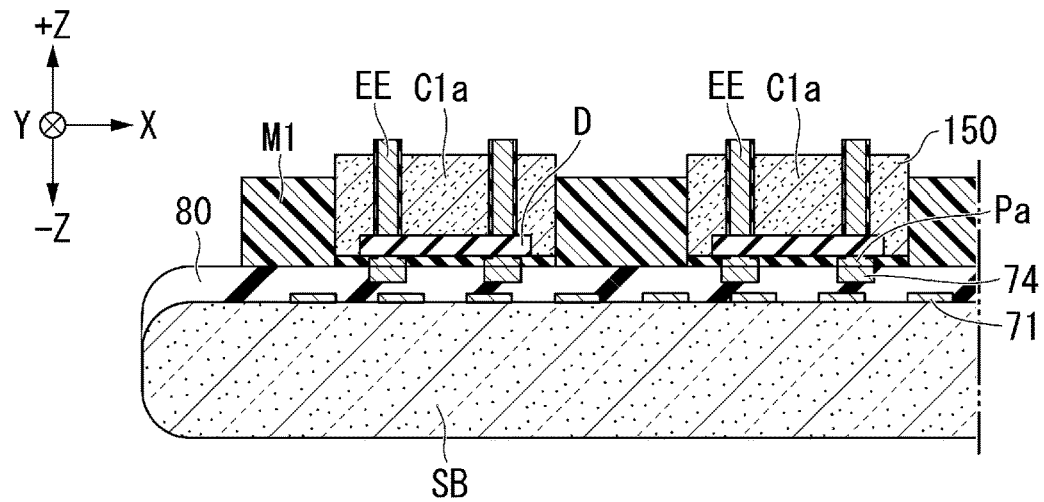
FIG. 10 is a cross-sectional view showing the method for manufacturing the semiconductor device according to the first embodiment.

As shown in FIG. 10, after a part of the resin body M is removed, the polished semiconductor substrate 150 is dry-etched. This exposes the tip of the electrode EE. Polishing the semiconductor substrate 150 and the resin body M and dry-etching the semiconductor substrate 150 are an example of "removing the first intermediate stacked body C1a in the thickness direction of the semiconductor substrate 150 to expose the electrode EE".

Figure 11:
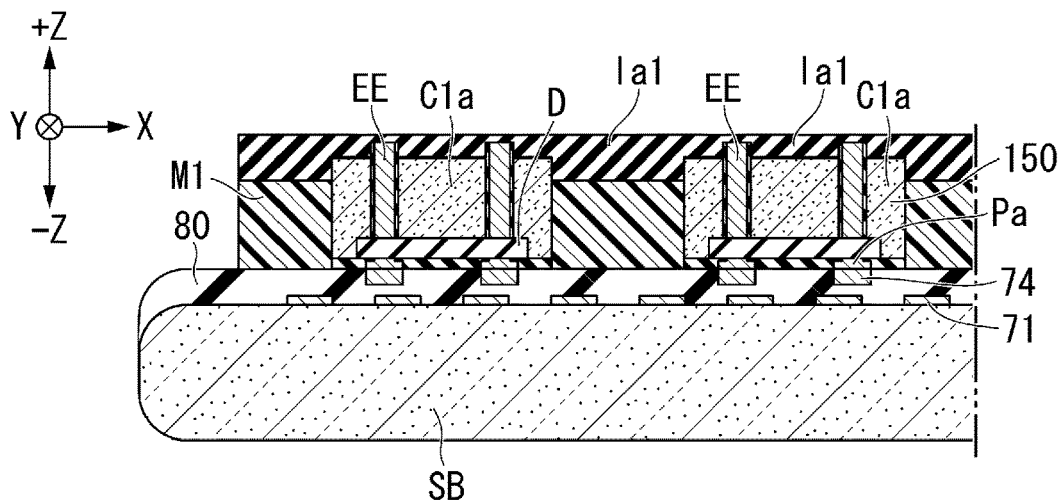
FIG. 11 is a cross-sectional view showing the method for manufacturing the semiconductor device according to the first embodiment.

As shown in FIG. 11, after exposing the tip of the electrode EE, for example, plasma-enhanced ALD (Plasma-Enhanced Atomic Layer Deposition) or chemical vapor deposition (CVD) is used to form an insulating layer Ia1 on the exposed surface of the electrode EE of the first intermediate stacked body C1a. The insulating layer Ia1 is an example of the "first insulating layer".

Figure 12:
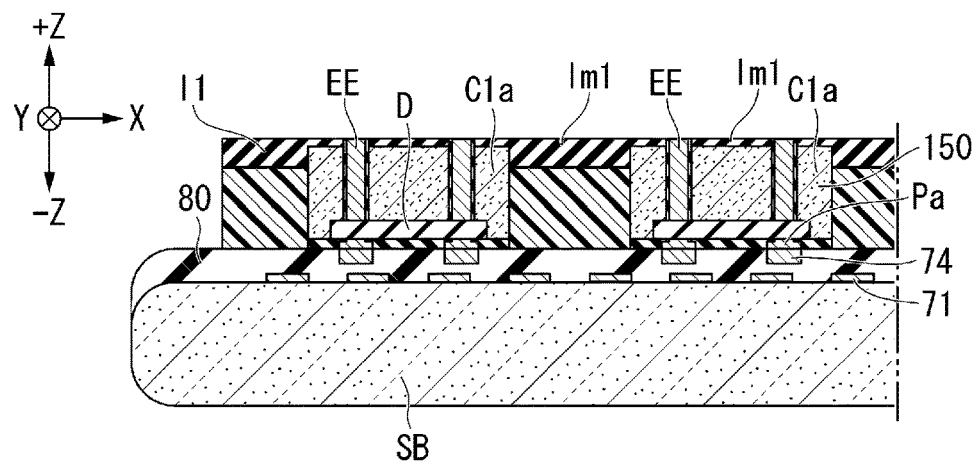
FIG. 12 is a cross-sectional view showing the method for manufacturing the semiconductor device according to the first embodiment.

As shown in FIG. 12, after forming the insulating layer Ia1, the insulating layer Ia1 is polished in the Z direction by, for example, CMP to expose the electrode EE. This forms the chip C1.

Figure 13:
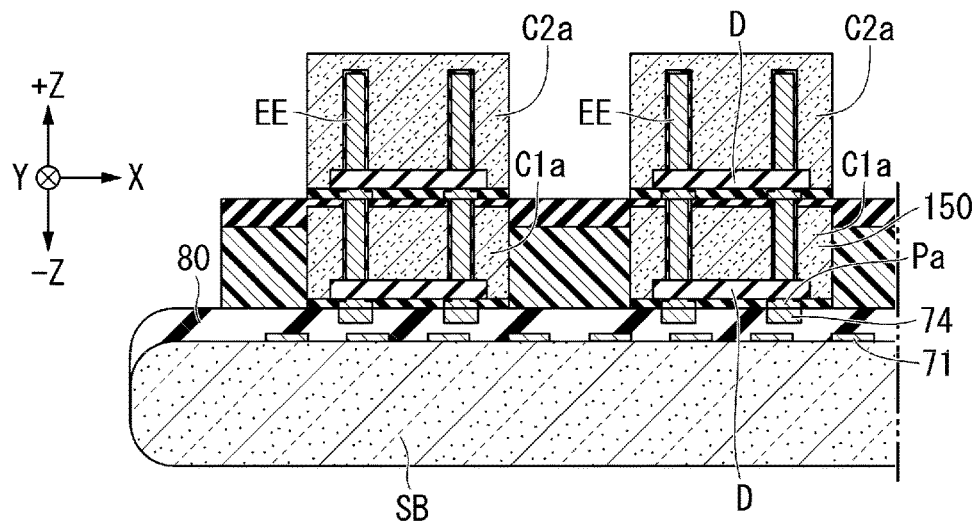
FIG. 13 is a cross-sectional view showing the method for manufacturing the semiconductor device according to the first embodiment.

As shown in FIG. 13, after polishing the insulating layer Ia1, the second intermediate stacked body C2a having a pad Pa is stacked on the chip C1 so that the pad Pa of the second intermediate stacked body C2a is connected to the electrode EE of the chip C1. The pad Pa of the second intermediate stacked body C2a is an example of a second pad. The second intermediate stacked body C2a has the same structure as the first intermediate stacked body C1a. The second intermediate stacked body C2a includes the stacked body 220 and the stacked body 210. The device layer D of the second intermediate stacked body C2a is an example of a "second device layer". The pad Pa of the second intermediate stacked body C2a is electrically connected to the stacked body 210 and the stacked body 220 of the second intermediate stacked body C2a. The second intermediate stacked body C2a includes the semiconductor substrate 150, the stacked body 210, and the electrode EE.

Hereinafter, the semiconductor device 1 is obtained by repeating the procedure from FIG. 6 to FIG. 13, stacking up to the chip 4, and peeling off the support substrate SB. The peeling method of the support substrate SB is not particularly limited. For example, the support substrate SB may be peeled off by polishing, the support substrate SB may be peeled off with a laser, or the support substrate SB may be peeled off mechanically. The support substrate SB may not be peeled off. The semiconductor device 1 is obtained.

The method for manufacturing the semiconductor device 1 of the first embodiment has been described above. In the method for manufacturing the semiconductor device 1 according to the first embodiment, the resin body M1, which is the first resin body, is located closer to the wiring layer 80 than the interface between the chip C1 and the chip C2. Therefore, when stacking the chip C2 on the chip C1, the resin body M1 does not hinder the stacking. As a result, the reliability of the electrical connection is improved. Further, by removing a part of the resin body M after the first intermediate stacked body C1a is exposed, it is possible to easily identify the position of the resin body M to be removed.

First Modification of Method for Manufacturing Semiconductor Device

A first modification of the method for manufacturing the semiconductor device 1 will be described. The description of the same process as in the manufacturing method of the first embodiment is omitted.

Figure 14:
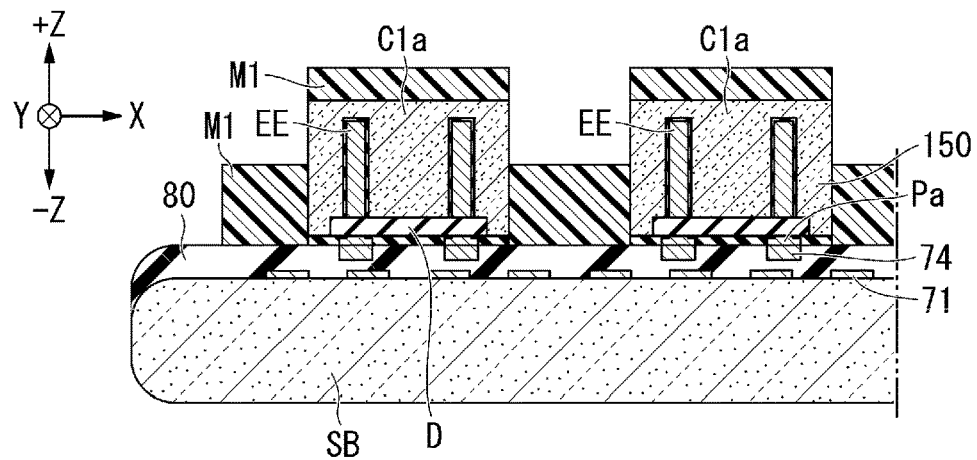
FIG. 14 is a cross-sectional view showing a first modification of the method for manufacturing the semiconductor device of the first embodiment.

As shown in FIG. 14, after forming the resin body M, a part of the resin body M is removed in the first stacking direction (Z direction). The method of removing a part of the resin body M is not particularly limited. For example, a part of the resin body M may be removed by dicing. The resin body M1 is formed by removing a part of the resin body M. A part of the resin body M is removed so that the resin body M1 is lower than the interface between the chip C1 and the second intermediate stacked body C2a, which will be described later. Specifically, a part of the resin body M is removed so that the resin body M1 is closer to the support substrate SB than the interface between the chip C1 and the second intermediate stacked body C2a, which will be described later.

Figure 15:
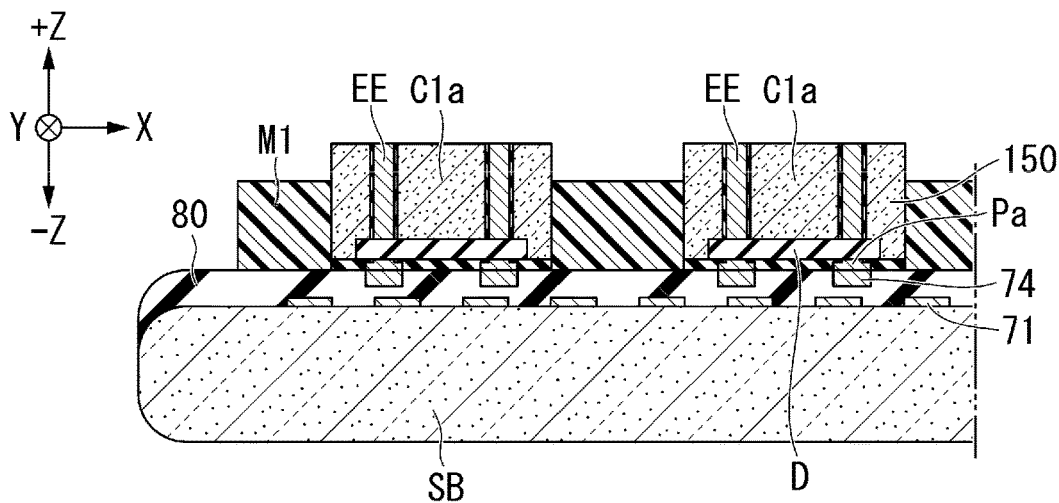
FIG. 15 is a cross-sectional view showing the first modification of the method for manufacturing the semiconductor device of the first embodiment.

As shown in FIG. 15, after removing a part of the resin body M, the semiconductor substrate 150 and the resin body M are polished in the Z direction by a backside grinder and chemical mechanical polishing (CMP) to expose the electrode EE.

Figure 16:
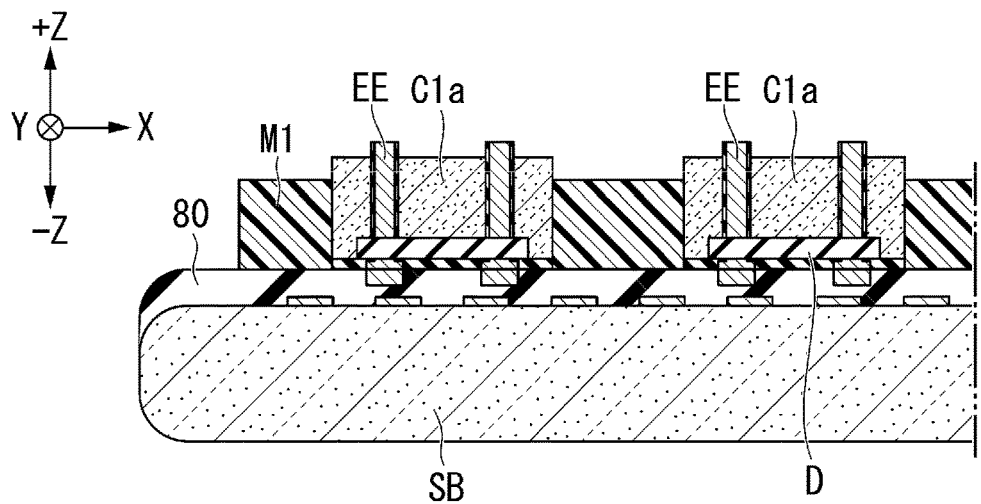
FIG. 16 is a cross-sectional view showing the first modification of the method for manufacturing the semiconductor device of the first embodiment.

As shown in FIG. 16, the polished semiconductor substrate 150 is dry-etched. This exposes the tip of the electrode EE.

Figure 17:
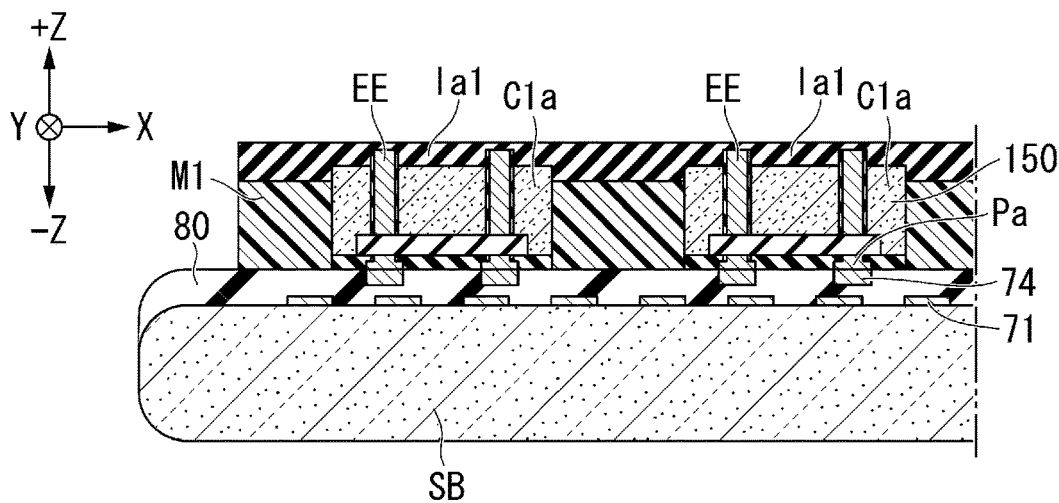
FIG. 17 is a cross-sectional view showing the first modification of the method for manufacturing the semiconductor device of the first embodiment.

As shown in FIG. 17, after dry etching, for example, plasma-enhanced ALD (Plasma-Enhanced Atomic Layer Deposition) or chemical vapor deposition (CVD) is used to form the insulating layer Ia1 on the exposed surface of the electrode EE of the first intermediate stacked body C1a.

Figure 18:
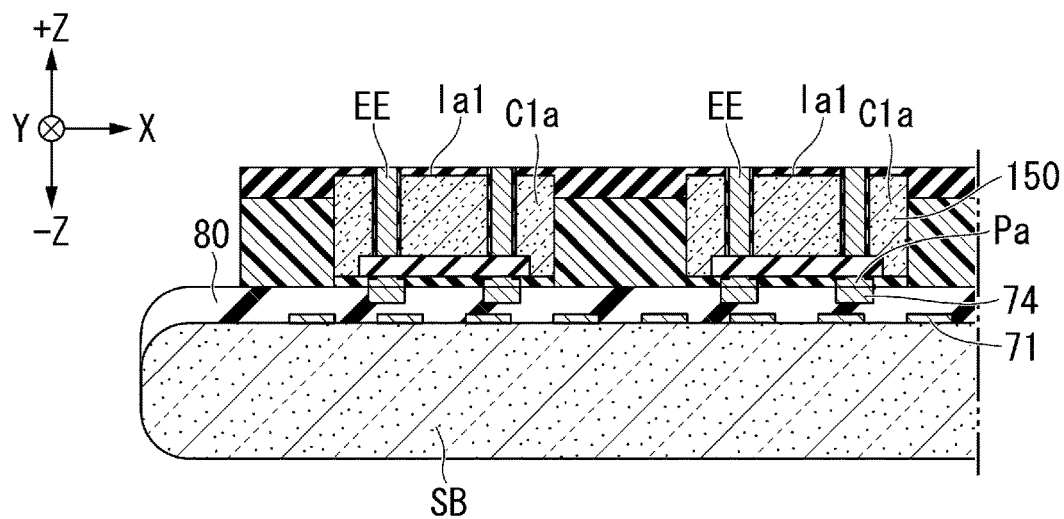
FIG. 18 is a cross-sectional view showing the first modification of the method for manufacturing the semiconductor device of the first embodiment.

As shown in FIG. 18, after polishing, the insulating layer Ia1 is polished in the Z direction by, for example, CMP to expose the electrode EE. This forms the chip C1.

Figure 19:
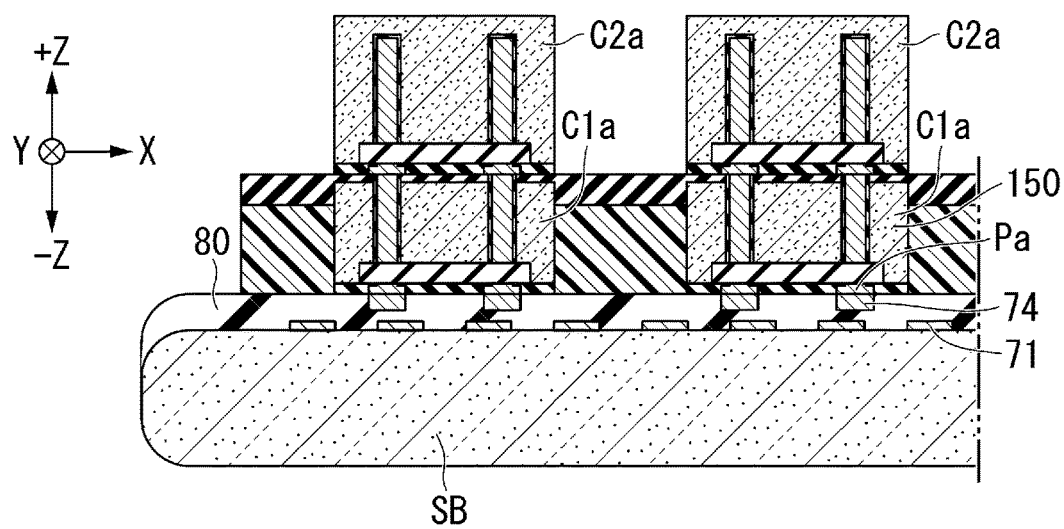
FIG. 19 is a cross-sectional view showing the first modification of the method for manufacturing the semiconductor device of the first embodiment.

As shown in FIG. 19, after polishing, the second intermediate stacked body C2a having the pad Pa is stacked on the chip C1 so that the pad Pa of the second intermediate stacked body C2a is connected to the electrode EE of the chip C1. The second intermediate stacked body C2a has the same structure as the first intermediate stacked body C1a. The device layer D of the second intermediate stacked body C2a is an example of the "second device layer". The pad Pa of the second intermediate stacked body C2a is electrically connected to the stacked body 210 and the stacked body 220 of the second intermediate stacked body C2a. The second intermediate stacked body C2a includes the semiconductor substrate 150, the stacked body 210, and the electrode EE. The electrode EE of the second intermediate stacked body C2a is electrically connected to the device layer D of the second intermediate stacked body C2a.

Thereafter, the semiconductor device 1 is obtained by repeating the same procedure, stacking up to the chip C4, and peeling off the support substrate SB. The peeling method of the support substrate SB is not particularly limited. For example, the support substrate SB may be peeled off by polishing, the support substrate SB may be peeled off with a laser, or the support substrate SB may be peeled off mechanically. The support substrate SB may not be peeled off.

The first modification of the method for manufacturing the semiconductor device 1 has been described above. In the first modification of the method for manufacturing the semiconductor device 1, the resin body M1, which is the first resin body, is located closer to the wiring layer 80 than the interface between the chip C1 and the chip C2. Therefore, when stacking the chip C2 on the chip C1, the resin body M1 does not hinder the stacking. As a result, the reliability of the electrical connection is improved.

Second Modification of Method for Manufacturing Semiconductor Device

A second modification of the method for manufacturing the semiconductor device 1 will be described. The description of the same process as in the manufacturing method of the first embodiment is omitted.

Figure 20:
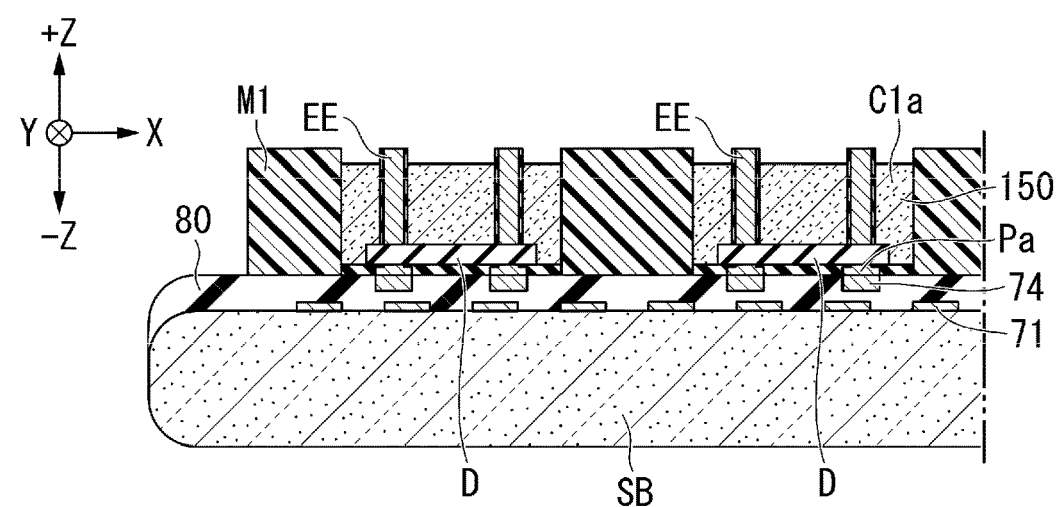
FIG. 20 is a cross-sectional view showing a second modification of the method for manufacturing the semiconductor device of the first embodiment.

As shown in FIG. 20, after polishing the semiconductor substrate 150 and the resin body M, the polished semiconductor substrate 150 is dry-etched. This exposes the tip of the electrode EE.

Figure 21:
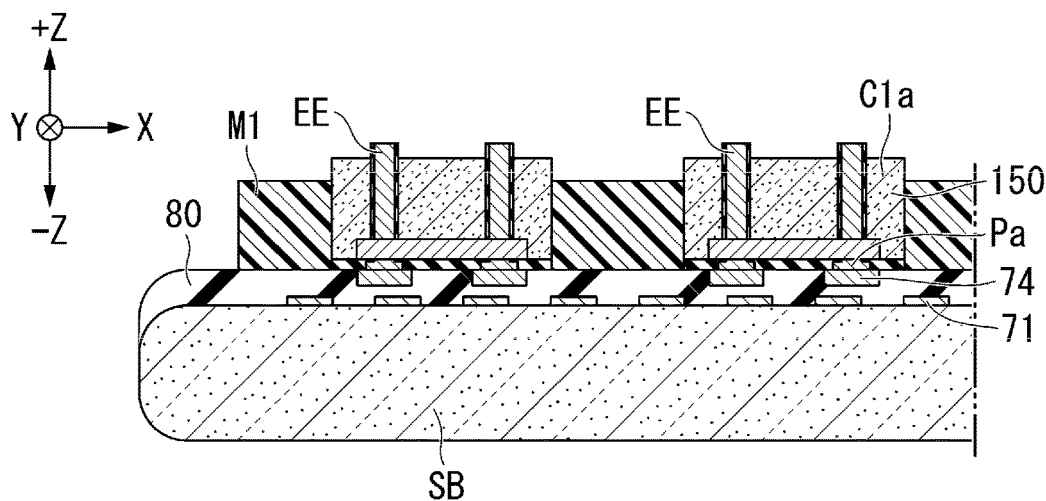
FIG. 21 is a cross-sectional view showing the second modification of the method for manufacturing the semiconductor device of the first embodiment.

As shown in FIG. 21, after dry etching, a part of the resin body M is removed so that the height of the resin body M in the first stacking direction (Z direction) is lower than the surface of the polished first intermediate stacked body C1a. The method of removing a part of the resin body M is not particularly limited. For example, a part of the resin body M may be removed by dicing. The resin body M1 is formed by removing a part of the resin body M. A part of the resin body M is removed so that the resin body M1 is closer to the support substrate SB than the interface between the chip C1 and the second intermediate stacked body C2a, which will be described later.

Figure 22:
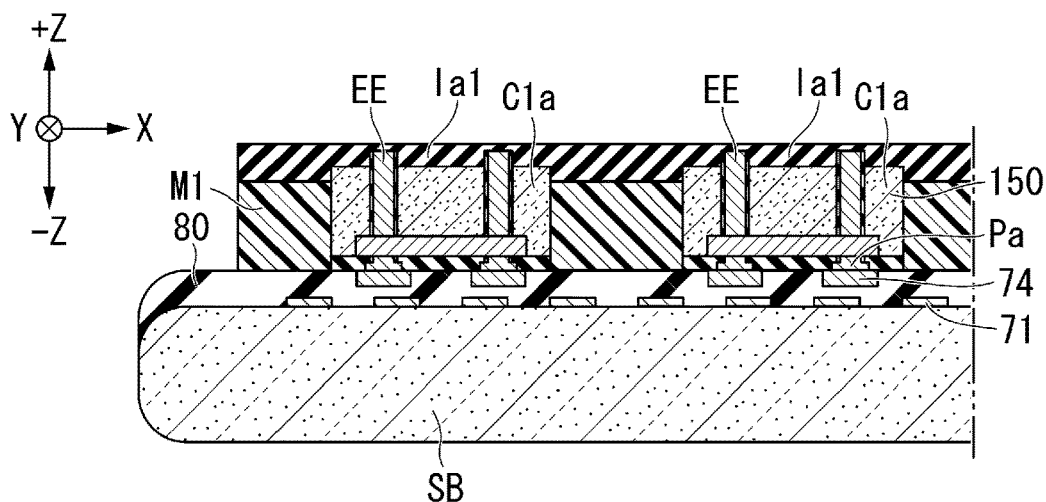
FIG. 22 is a cross-sectional view showing the second modification of the method for manufacturing the semiconductor device of the first embodiment.

As shown in FIG. 22, after removing a part of the resin body M, for example, plasma-enhanced ALD (Plasma-Enhanced Atomic Layer Deposition) or chemical vapor deposition (CVD) is used to form the insulating layer Ia1.

Figure 23:
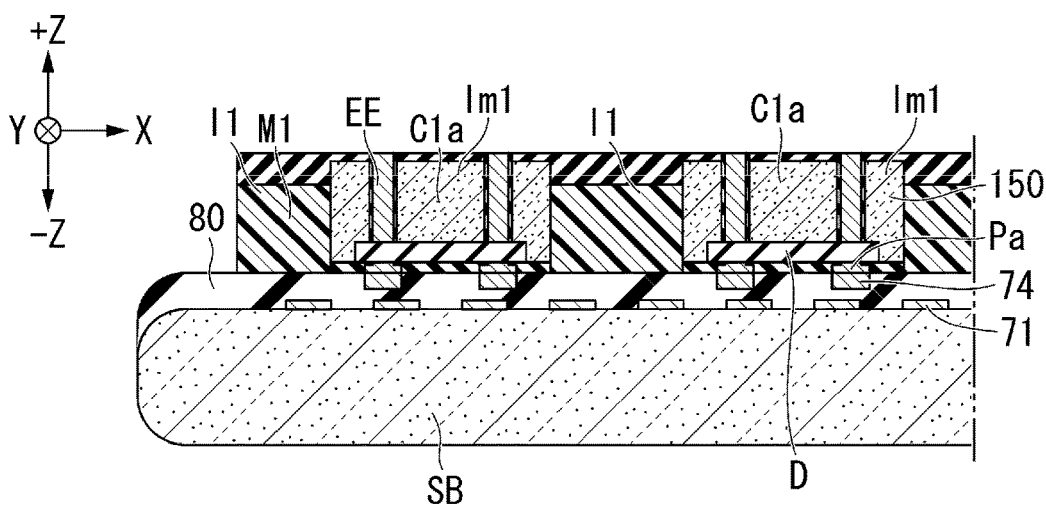
FIG. 23 is a cross-sectional view showing the second modification of the method for manufacturing the semiconductor device of the first embodiment.

As shown in FIG. 23, after forming the insulating layer Ia1, the insulating layer Ia1 is polished in the Z direction by, for example, CMP to expose the electrodes EE. This forms the chip C1.

Figure 24:
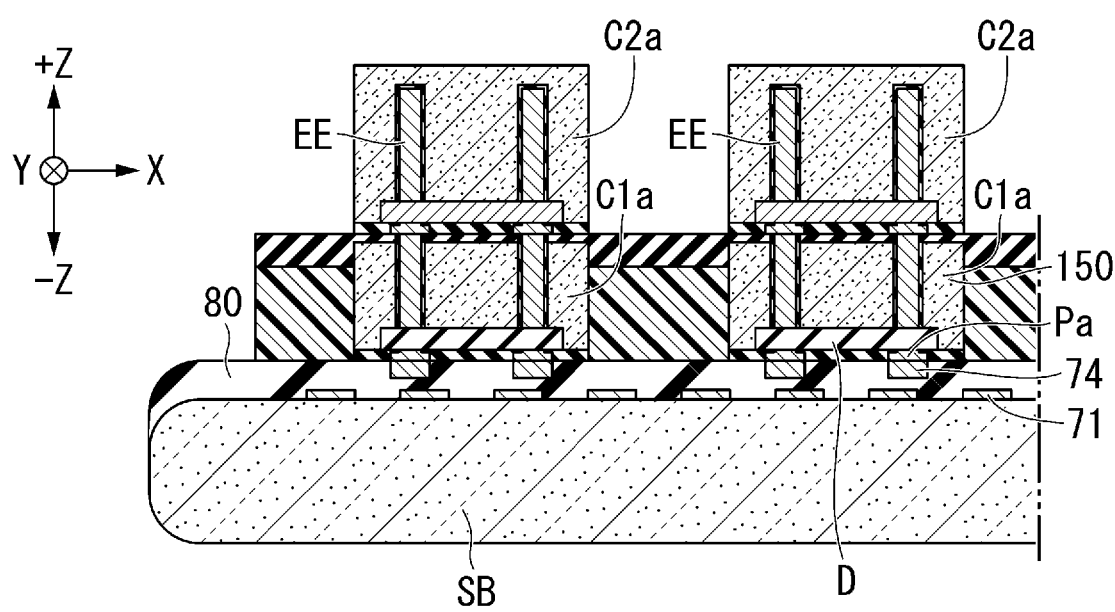
FIG. 24 is a cross-sectional view showing the second modification of the method for manufacturing the semiconductor device of the first embodiment.

As shown in FIG. 24, after polishing the insulating layer Ia1, the second intermediate stacked body C2a having the pad Pa is stacked on the chip C1 so that the pad Pa of the second intermediate stacked body C2a is connected to the electrode EE of the chip C1. The second intermediate stacked body C2a includes the stacked body 220 and the stacked body 210, like the first intermediate stacked body C1a. The stacked body 210 and the stacked body 220 of the second intermediate stacked body C2a are examples of the "second device layer". The pad Pa of the second intermediate stacked body C2a is electrically connected to the stacked body 210 and the stacked body 220 of the second intermediate stacked body C2a. The second intermediate stacked body C2a includes the semiconductor substrate 150, the stacked body 210, and the electrode EE.

Thereafter, the semiconductor device 1 is obtained by repeating the same procedure, stacking up to the chip C4, and peeling off the support substrate SB. The peeling method of the support substrate SB is not particularly limited. For example, the support substrate SB may be peeled off by polishing, the support substrate SB may be peeled off with a laser, or the support substrate SB may be peeled off mechanically. The support substrate SB may not be peeled off.

The second modification of the method for manufacturing the semiconductor device 1 has been described above. In the second modification of the method for manufacturing the semiconductor device 1, the resin body M1, which is the first resin body, is located closer to the wiring layer 80 than the interface between the chip C1 and the chip C2. Therefore, when stacking the chip C2 on the chip C1, the resin body M1 does not hinder the stacking. As a result, the reliability of the electrical connection is improved.

Third Modification of Manufacturing Method of Semiconductor Device 1

A stacked body is formed by stacking the chips C1 to C4 on a substrate on which the wiring layer 80 is not formed via a release layer according to the manufacturing method of the present embodiment. The substrate is removed from the stacked body. The semiconductor device according to the first embodiment is formed by forming a wiring layer on the exposed pad of the chip C1.

Second Embodiment

Figure 25:
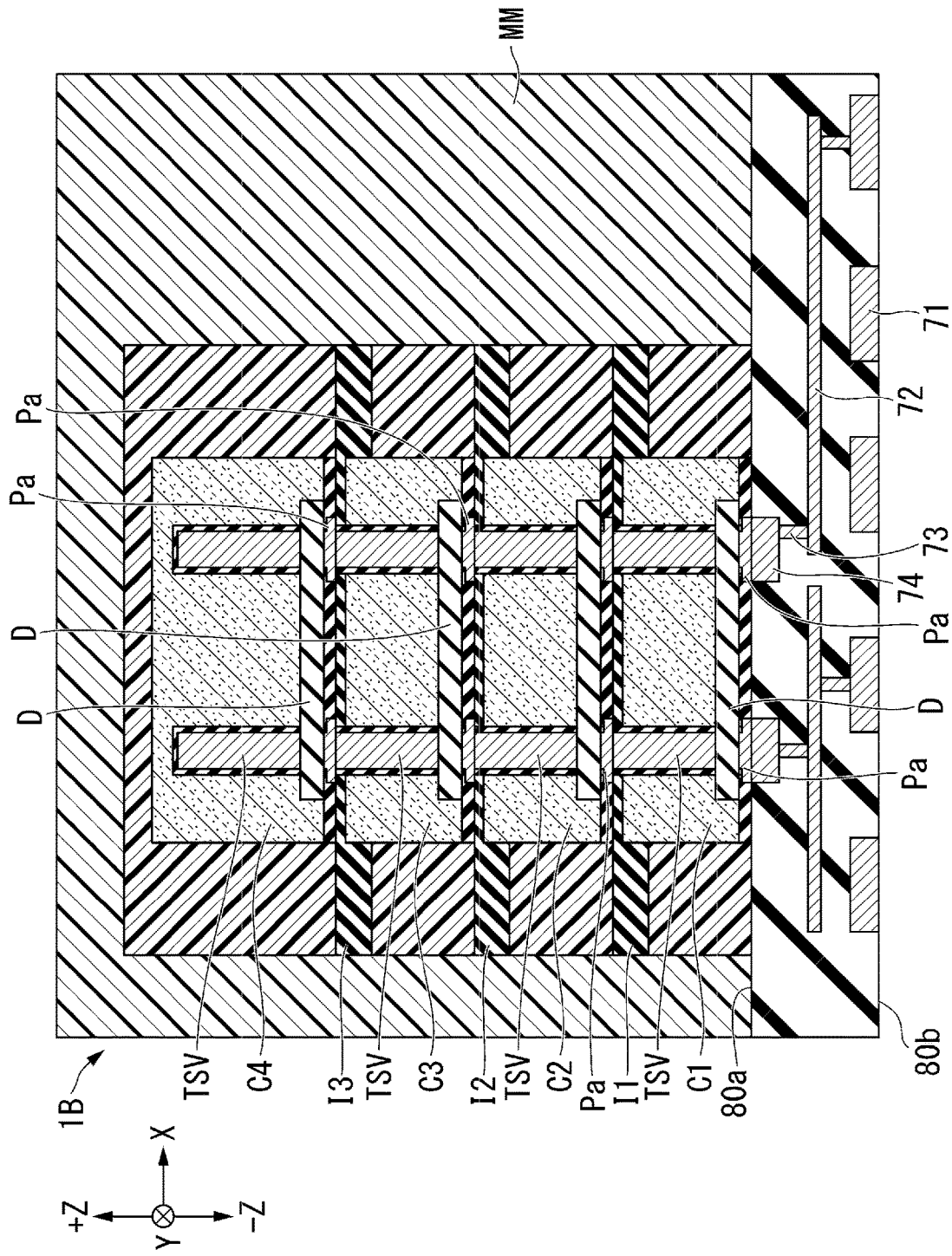
FIG. 25 is a cross-sectional view showing the configuration of a semiconductor device according to a second embodiment.

Next, a semiconductor device 1B according to a second embodiment of the present disclosure will be described with reference to FIG. 25. In the second embodiment, the same reference numerals are assigned to the same components as those in the first embodiment, the description thereof is omitted, and only the different points will be described.

Structure of Semiconductor Device

An example of the structure of the semiconductor device 1B according to the second embodiment will be described below. FIG. 25 is a cross-sectional view showing the configuration of the semiconductor device 1B. The semiconductor device 1B includes, for example, the wiring layer 80, the chip C1, the chip C2, the chip C3, and the chip C4. The semiconductor device 1B further includes the resin body M1 covering at least a part of the periphery of the chip C1, the resin body M2 covering at least a part of the periphery of the chip C2, the insulating layer I1 between the resin bodies M1 and M2, the resin body M3 covering at least a part of the periphery of the chip C3, the insulating layer I2 between the resin bodies M2 and M3, the resin body M4 covering at least a part of the periphery of the chip C4, and the insulating layer I3 between the resin bodies M3 and M4. The pad 74 of the wiring layer 80 is electrically connected to the pad Pa of the chip C1. Also, the semiconductor device 1B includes a resin body MM that covers the chip C1, the chip C2, the chip C3, the chip C4, the resin body M1, the resin body M2, the resin body M3, the resin body M4, the insulating layer I1, the insulating layer I2, and the insulating layer I3.

The semiconductor device 1B of the second embodiment has been described above. In the semiconductor device 1B according to the second embodiment, the resin body M1, which is the first resin body, is located closer to the wiring layer 80 than the interface between the chip C1 and the chip C2. Therefore, when stacking the chip C2 on the chip C1, the resin body M1 does not hinder the stacking. As a result, the reliability of the electrical connection is improved and the electrical characteristics are improved. Also, since the resin body MM that covers the chip C1, the chip C2, the chip C3, the chip C4, the resin body M1, the resin body M2, the resin body M3, the resin body M4, the insulating layer I1, the insulating layer I2, and the insulating layer I3 is provided, the durability of the semiconductor device 1 can be improved.

Third Embodiment

Figure 26:
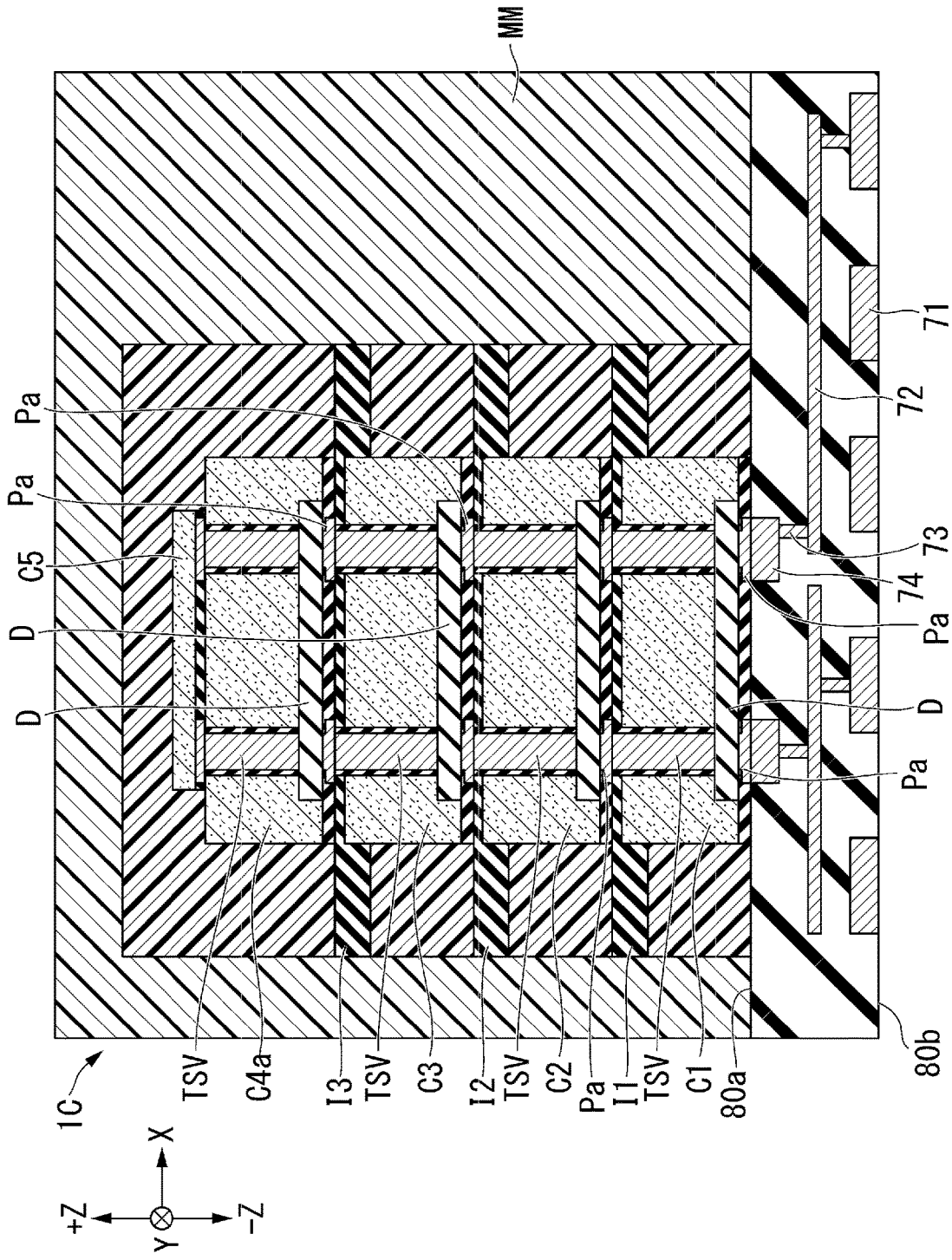
FIG. 26 is a cross-sectional view showing the configuration of a semiconductor device according to a third embodiment.

Next, a semiconductor device 1C according to a third embodiment of the present disclosure will be described with reference to FIG. 26. In the third embodiment, the same reference numerals are assigned to the same components as those in the first embodiment, the description thereof is omitted, and only the different points are described.

Structure of Semiconductor Device

An example of the structure of the semiconductor device 1C according to the third embodiment will be described below. FIG. 26 is a cross-sectional view showing the configuration of the semiconductor device 1C. The semiconductor device 1C includes, for example, the wiring layer 80, the chip C1, the chip C2, the chip C3, a chip C4a, and a chip C5. The semiconductor device 1C further includes the resin body M1 covering at least a part of the periphery of the chip C1, the resin body M2 covering at least a part of the periphery of the chip C2, the insulating layer I1 between the resin bodies M1 and M2, the resin body M3 covering at least a part of the periphery of the chip C3, the insulating layer I2 between the resin bodies M2 and M3, the resin body M4 covering at least a part of the periphery of the chip C4a, and the insulating layer I3 between the resin bodies M3 and M4. The pad 74 of the wiring layer 80 is electrically connected to the pad Pa of the chip C1. Also, the semiconductor device 1C includes the resin body MM that covers the chip C1, the chip C2, the chip C3, the chip C4a, the chip C5, the resin body M1, the resin body M2, the resin body M3, the resin body M4, the insulating layer I1, the insulating layer I2, and the insulating layer I3. The chip C4a includes a through via TSV. The through via TSV of the chip C4a and the pad Pa of the chip C5 are electrically connected. The chip C5 is a chip containing a logic circuit.

The semiconductor device 1C of the third embodiment has been described above. In the semiconductor device 1C according to the third embodiment, the resin body M1, which is the first resin body, is located closer to the wiring layer 80 than the interface between the chip C1 and the chip C2. Therefore, when stacking the chip C2 on the chip C1, the resin body M1 does not hinder the stacking. As a result, the reliability of the electrical connection is improved and the electrical characteristics are improved. Also, since the resin body MM covering the chip C1, the chip C2, the chip C3, the chip C4, the resin body M1, the resin body M2, the resin body M3, the resin body M4, the insulating layer I1, the insulating layer I2, and the insulating layer I3 is provided, the durability of the semiconductor device 1 can be improved.

Fourth Embodiment

Figure 27:
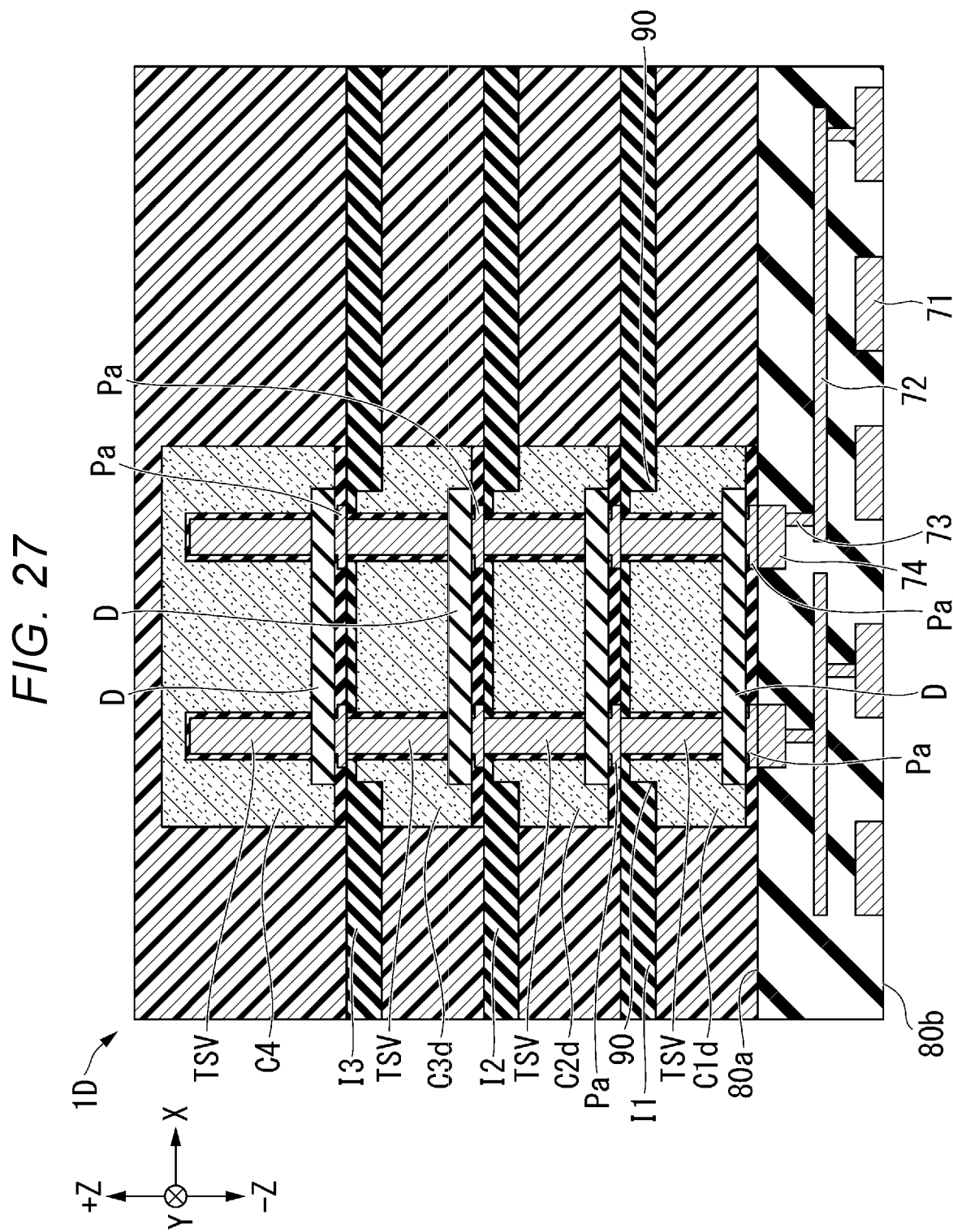
FIG. 27 is a cross-sectional view showing the configuration of a semiconductor device according to a fourth embodiment.

Next, a semiconductor device 1D according to a fourth embodiment of the present disclosure will be described with reference to FIG. 27. In the fourth embodiment, the same reference numerals are assigned to the same components as those in the first embodiment, the description thereof is omitted, and only the different points will be described.
Structure of Semiconductor Device An example of the structure of the semiconductor device 1D according to the fourth embodiment will be described below. FIG. 27 is a cross-sectional view showing the configuration of the semiconductor device 1D. The semiconductor device 1D includes, for example, the wiring layer 80, a chip C1d, a chip C2d, a chip C3d, and a chip C4. The semiconductor device 1D further includes the resin body M1 covering at least a part of the periphery of the chip C1d, the resin body M2 covering at least a part of the periphery of the chip C2d, the insulating layer I1 between the resin bodies M1 and M2, the resin body M3 covering at least a part of the periphery of the chip C3d, the insulating layer I2 between the resin bodies M2 and M3, the resin body M4 covering at least a part of the periphery of the chip C4, and the insulating layer I3 between the resin bodies M3 and M4. The pad 74 of the wiring layer 80 is electrically connected to the pad Pa of the chip C1. The chip C1d includes a recess 90 on the outer peripheral portion of the surface on the chip C2 side. The chip C2d has the recess 90 on the outer peripheral portion of the surface on the chip C3 side. The chip C3d includes the recess 90 on the outer peripheral portion of the surface on the chip C4 side. The recess 90 extends continuously over the entire periphery of each of the chips C1d, C2d, and C3d. The recess 90 is annular. The bottom surface of the recess 90 is above the upper surface of the device layer D in each of the chips C1d, C2d, and C3d.

The semiconductor device 1D of the fourth embodiment has been described above. In the semiconductor device 1D according to the fourth embodiment, the resin body M1, which is the first resin body, is located closer to the wiring layer 80 than the interface between the chip C1d and the chip C2d. Therefore, when stacking the chip C2d on the chip C1d, the resin body M1 does not hinder stacking. As a result, the reliability of the electrical connection is improved and the electrical characteristics are improved. Moreover, since the chip C1d, the chip C2d, and the chip C3d are provided with the recess 90, the chips can be stacked more easily.
Method for Manufacturing Semiconductor Device A method for manufacturing the semiconductor device 1D according to the fourth embodiment will be described. The description of the same process as in the manufacturing method of the first embodiment is omitted.

Figure 28:
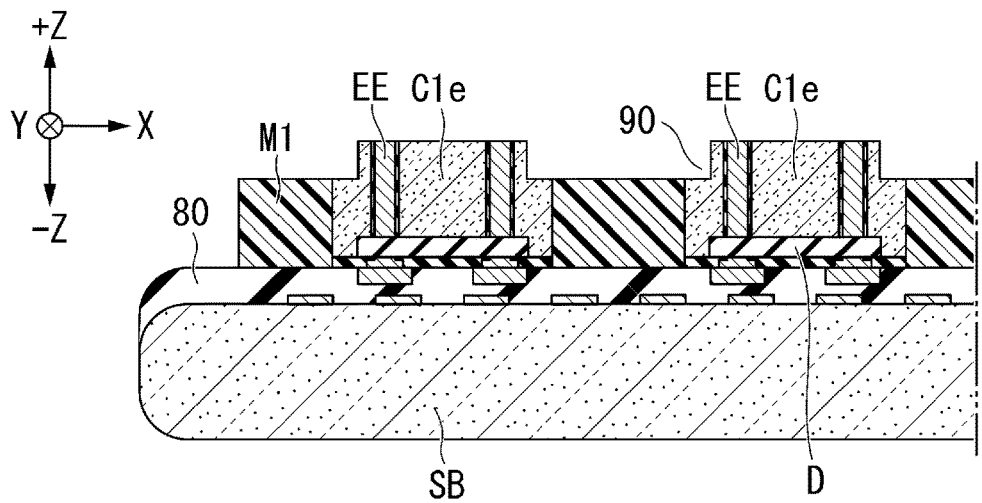
FIG. 28 is a cross-sectional view showing a method for manufacturing the semiconductor device according to the fourth embodiment.

As shown in FIG. 28, after covering a first intermediate stacked body C1e with the resin body M, the semiconductor substrate 150 and the resin body M are polished by, for example, a backside grinder and chemical mechanical polishing (CMP) in the thickness direction (Z direction) of the semiconductor substrate 150 to expose the electrode EE.

As shown in FIG. 28, after polishing the semiconductor substrate 150 and the resin body M, a part of the resin body M is removed so that the height of the resin body M in the first stacking direction (Z direction) is lower than the surface of the polished first intermediate stacked body C1e. At this time, the end portion of the semiconductor substrate 150 in contact with the resin body M is also removed. As a result, the recess 90 is formed at the end portion of the semiconductor substrate 150. A method of removing a part of the resin body M and the semiconductor substrate 150 is not particularly limited. For example, a part of the resin body M may be removed by dicing. The resin body M1 is formed by removing a part of the resin body M. Here, a part of the resin body M is removed so that the resin body M1 is closer to the support substrate SB than the interface between the chip C1 and a second intermediate stacked body C2e, which will be described later.

Figure 29:
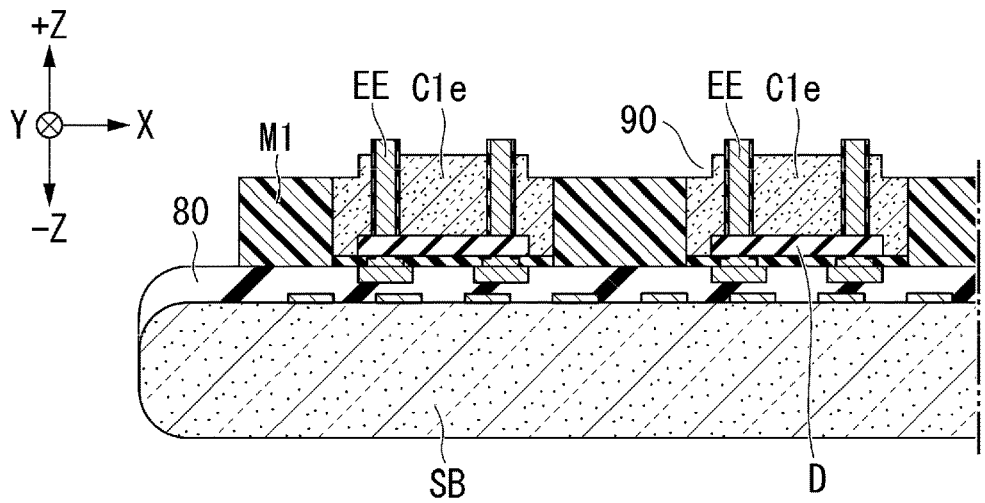
FIG. 29 is a cross-sectional view showing the method for manufacturing the semiconductor device according to the fourth embodiment.

As shown in FIG. 29, after removing a part of the resin body M and the semiconductor substrate 150, the polished semiconductor substrate 150 is dry-etched. This exposes the tip of the electrode EE.

Figure 30:
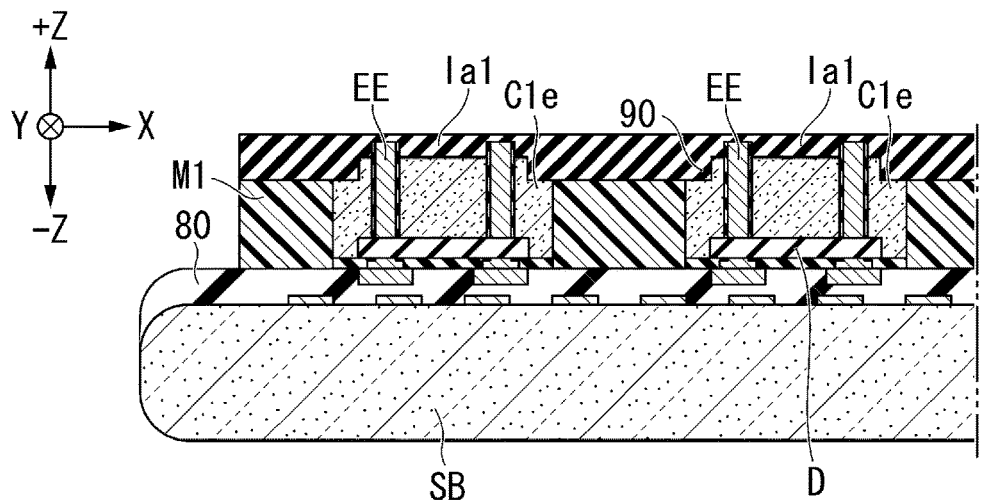
FIG. 30 is a cross-sectional view showing the method for manufacturing the semiconductor device according to the fourth embodiment.

As shown in FIG. 30, after exposing the tip of the electrode EE, for example, plasma-enhanced ALD (Plasma-Enhanced Atomic Layer Deposition) or chemical vapor deposition (CVD) is used to form the insulating layer Ia1.

Figure 31:
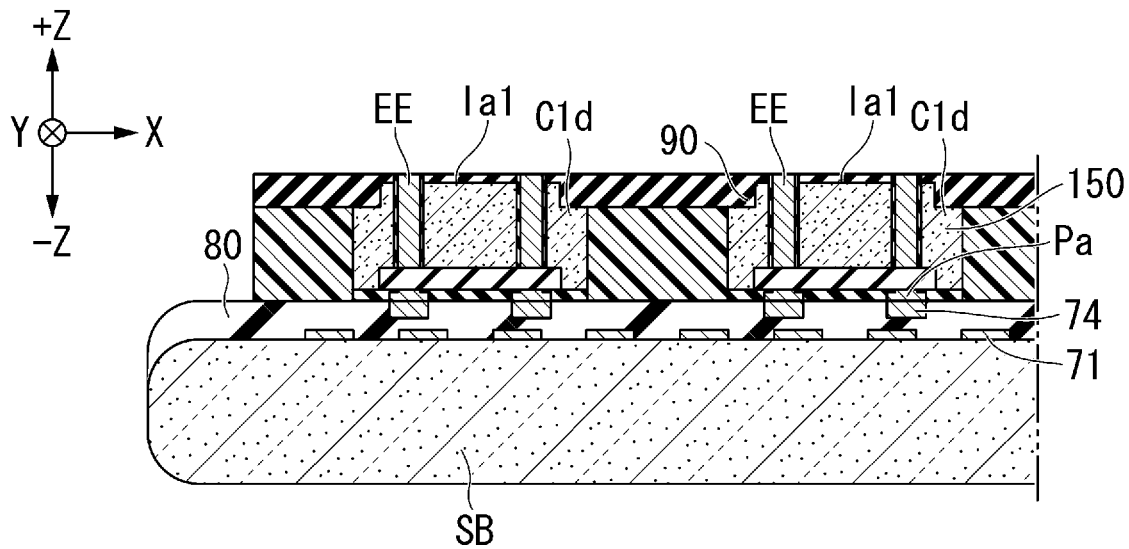
FIG. 31 is a cross-sectional view showing the method for manufacturing the semiconductor device according to a fourth embodiment.

As shown in FIG. 31, after forming the insulating layer Ia1, the insulating layer Ia1 is polished in the Z direction by, for example, CMP to expose the electrodes EE. This forms the chip C1.

Figure 32:
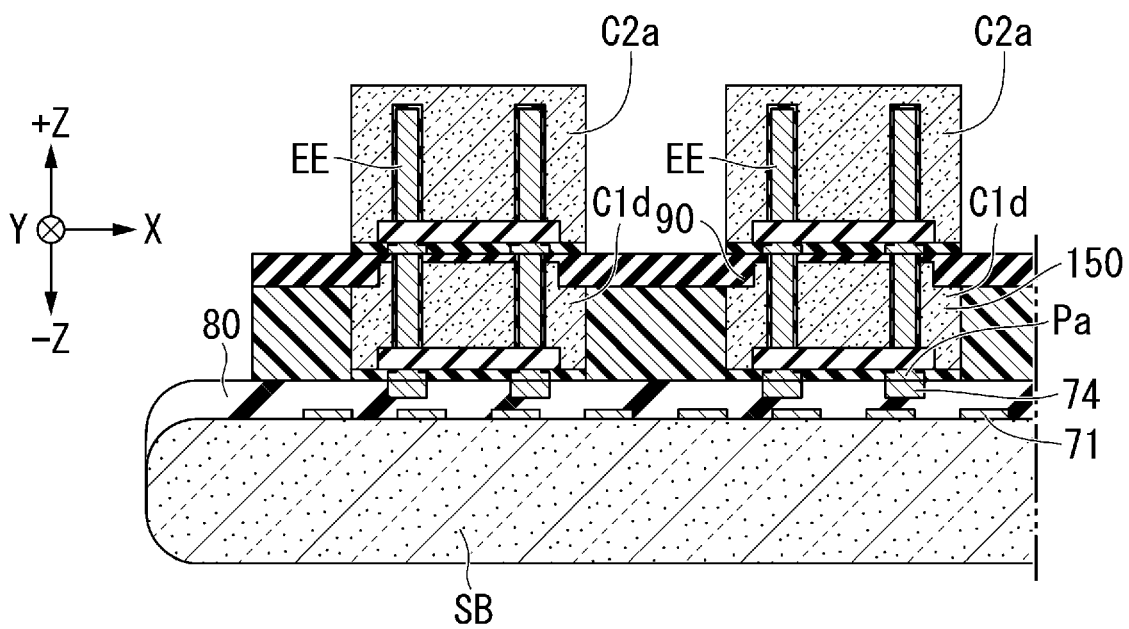
FIG. 32 is a cross-sectional view showing the method for manufacturing the semiconductor device according to the fourth embodiment.

As shown in FIG. 32, after polishing the insulating layer Ia1, the second intermediate stacked body C2e having the pad Pa is stacked on the chip C1 so that the pad Pa of the second intermediate stacked body C2e is connected to the electrode EE of the chip C1. The pad Pa of the second intermediate stacked body C2e is an example of the second pad. The second intermediate stacked body C2e has the same structure as the first intermediate stacked body C1e. The second intermediate stacked body C2e includes the stacked body 220 and the stacked body 210. The device layer D of the second intermediate stacked body C2e is an example of the "second device layer". The pad Pa of the second intermediate stacked body C2e is electrically connected to the stacked body 210 and the stacked body 220 of the second intermediate stacked body C2e. The second intermediate stacked body C2e includes the semiconductor substrate 150, the stacked body 210, and the electrode EE.

Thereafter, the semiconductor device 1D is obtained by repeating the same procedure, stacking up to the chip C4, and peeling off the support substrate SB. The peeling method of the support substrate SB is not particularly limited. For example, the support substrate SB may be peeled off by polishing, the support substrate SB may be peeled off with a laser, or the support substrate SB may be peeled off mechanically. The support substrate SB may not be peeled off. The semiconductor device 1D is obtained.

The method for manufacturing the semiconductor device 1D according to the fourth embodiment has been described above. In the manufacturing method of the semiconductor device 1D according to the fourth embodiment, the resin body M1, which is the first resin body, is located closer to the wiring layer 80 than the interface between the chip C1d and the chip C2d. Therefore, when stacking the chip C2d on the chip C1d, the resin body M1 does not hinder stacking. As a result, the reliability of the electrical connection is improved. Moreover, since the chip C1d, the chip C2d, and the chip C3d are provided with the recess 90, the chips are stacked easily.

According to at least one embodiment described above, the semiconductor device includes a wiring layer, a first stacked body stacked on the wiring layer, a second stacked body stacked on the first stacked body, and a first resin body covering at least a part of the periphery of the first stacked body. When the direction in which the first stacked body and the second stacked body are stacked is the stacking direction, the first stacked body includes a first pad connected to the wiring layer, a first device layer electrically connected to the first pad, and a first electrode electrically connected to the first device layer. The second stacked body includes a second pad electrically connected to the first electrode and a second device layer electrically connected to the second pad. In the stacking direction, the first resin body is closer to the wiring layer than the interface between the first stacked body and the second stacked body. According to such a configuration, the electrical characteristics can be improved.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
   a wiring layer;
   a first stacked body disposed on the wiring layer;
   a second stacked body disposed on the first stacked body in a stacking direction; and
   a first resin body disposed around a periphery of the first stacked body, wherein
   the first stacked body includes a first pad electrically connected to the wiring layer, a first device layer electrically connected to the first pad, and a first electrode electrically connected to the first device layer,
   the second stacked body includes a second pad electrically connected to the first electrode and a second device layer electrically connected to the second pad, and
   in the stacking direction, the first resin body is vertically located closer to the wiring layer than an interface between the first stacked body and the second stacked body.

2. A method for manufacturing a semiconductor device, the method comprising:
   providing a substrate;
   providing a first stacked body including a first semiconductor substrate, a first device layer, a first pad electrically connected to the first device layer, and a first electrode electrically connected to the first device layer and embedded in the first semiconductor substrate;
   connecting the first pad to the substrate;
   covering the first stacked body with a first resin body;
   exposing the first electrode by removing a portion of the first semiconductor substrate;
   forming a first insulating layer on the first stacked body;
   polishing the first insulating layer and the first electrode;
   providing a second stacked body on the first stacked body in a direction, wherein the second stacked body includes a second semiconductor substrate, a second device layer, and a second pad electrically connected to the second device layer; and
   connecting the second pad to the first electrode, wherein
   in the direction, a part of the first resin body is removed so that a surface of the first resin body is lower than an interface between the first stacked body and the second stacked body.

3. The method for manufacturing a semiconductor device according to claim 2, wherein
   after exposing the first electrode and before forming the first insulating layer on the first stacked body, the part of the first resin body is removed so that the surface of the first resin body is lower than the interface between the first stacked body and the second stacked body.

4. The method for manufacturing a semiconductor device according to claim 2, wherein
   after covering the first stacked body with the first resin body and before exposing the first electrode, the part of the first resin body is removed so that the surface of the first resin body is lower than the interface between the first stacked body and the second stacked body.

5. The method for manufacturing a semiconductor device according to claim 2, wherein
   the first stacked body is peeled off from the substrate, and a wiring layer is formed on the first pad.

* * * * *